(12) United States Patent
Chatterjee et al.

(10) Patent No.: US 11,789,649 B2
(45) Date of Patent: Oct. 17, 2023

(54) COMBINED ON-PACKAGE AND OFF-PACKAGE MEMORY SYSTEM

(71) Applicant: NVIDIA Corporation, Santa Clara, CA (US)

(72) Inventors: Niladrish Chatterjee, Kirkland, WA (US); James Michael O'Connor, Austin, TX (US); Donghyuk Lee, Cedar Park, TX (US); Gaurav Uttreja, Santa Clara, CA (US); Wishwesh Anil Gandhi, Sunnyvale, CA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 17/237,165

(22) Filed: Apr. 22, 2021

(65) Prior Publication Data

US 2022/0342595 A1 Oct. 27, 2022

(51) Int. Cl.
*G06F 3/06* (2006.01)
*G06F 12/06* (2006.01)
(Continued)

(52) U.S. Cl.
CPC .......... *G06F 3/0659* (2013.01); *G06F 3/0604* (2013.01); *G06F 3/0673* (2013.01);
(Continued)

(58) Field of Classification Search
CPC ...... G06F 3/0604; G06F 3/061; G06F 3/0646; G06F 3/0647; G06F 3/0659;
(Continued)

(56) References Cited

U.S. PATENT DOCUMENTS 5,857,210 A 1/1999 Tremblay et al.
5,873,104 A 2/1999 Tremblay et al.
(Continued)

OTHER PUBLICATIONS

M. R. Meswani, S. Blagodurov, D. Roberts, J. Slice, M. Ignatowski and G. H. Loh, "Heterogeneous memory architectures: A HW/SW approach for mixing die-stacked and off-package memories," 2015 IEEE 21st International Symposium on High Performance Computer Architecture (HPCA), 2015, pp. 126-136. (Year: 2015).*
(Continued)

*Primary Examiner* — Reginald G Bragdon
*Assistant Examiner* — Aaron D Ho
(74) *Attorney, Agent, or Firm* — Leydig, Voit & Mayer, Ltd.

(57) ABSTRACT

A combined on-package and off-package memory system uses a custom base-layer within which are fabricated one or more dedicated interfaces to off-package memories. An on-package processor and on-package memories are also directly coupled to the custom base-layer. The custom base-layer includes memory management logic between the processor and memories (both off and on package) to steer requests. The memories are exposed as a combined memory space having greater bandwidth and capacity compared with either the off-package memories or the on-package memories alone. The memory management logic services requests while maintaining quality of service (QoS) to satisfy bandwidth requirements for each allocation. An allocation may include any combination of the on and/or off package memories. The memory management logic also manages data migration between the on and off package memories.

21 Claims, 11 Drawing Sheets

(51) Int. Cl.
*G06F 12/10* (2016.01)
*H01L 25/18* (2023.01)

(52) U.S. Cl.
CPC .......... *G06F 12/0607* (2013.01); *G06F 12/10* (2013.01); *G06F 2212/151* (2013.01); *G06F 2212/154* (2013.01); *G06F 2212/657* (2013.01); *H01L 25/18* (2013.01)

(58) Field of Classification Search
CPC ...... G06F 3/0673; G06F 3/068; G06F 3/0683; G06F 3/0685; G06F 12/0607; G06F 12/10; G06F 2212/1016; G06F 2212/15; G06F 2212/151; G06F 2212/152; G06F 2212/154; G06F 2212/163; G06F 2212/165; G06F 2212/173; G06F 2212/657; G11C 11/401–4067; H01L 25/18; H01L 25/065–0657; H01L 27/108–10897
USPC ....................................................... 711/154
See application file for complete search history.

(56) References Cited

U.S. PATENT DOCUMENTS

| | | | |
|---|---|---|---|
| 5,873,105 | A | 2/1999 | Tremblay et al. |
| 9,391,915 | B2* | 7/2016 | Saxena ................ H04L 47/215 |
| 9,535,831 | B2 | 1/2017 | Jayasena et al. |
| 9,910,605 | B2 | 3/2018 | Jayasena et al. |
| 10,083,891 | B1* | 9/2018 | Graf ........................ H01L 25/16 |
| 10,593,380 | B1* | 3/2020 | Volpe ...................... G06F 17/18 |
| 10,790,039 | B1* | 9/2020 | Lee ................... G11C 29/56016 |
| 11,158,604 | B2* | 10/2021 | Cheng ..................... H01L 25/18 |
| 11,210,218 | B1* | 12/2021 | Tavallaei ............. G06F 12/0607 |
| 2006/0187945 | A1* | 8/2006 | Andersen ................ H04L 47/50 370/412 |
| 2007/0153697 | A1* | 7/2007 | Kwan .................... H04L 47/627 370/468 |
| 2014/0164690 | A1* | 6/2014 | De ....................... G11C 7/1072 711/105 |
| 2015/0006805 | A1* | 1/2015 | Feekes ...................... G06F 1/32 711/105 |
| 2017/0300415 | A1* | 10/2017 | Bonen ................. G06F 12/0871 |
| 2018/0004456 | A1* | 1/2018 | Talwar .................... G06F 3/067 |
| 2018/0024932 | A1* | 1/2018 | Nachimuthu ......... G06F 9/5027 711/213 |
| 2018/0095821 | A1* | 4/2018 | Vogt .................... G11C 11/4093 |
| 2018/0157602 | A1* | 6/2018 | Frey ....................... G06F 9/5083 |
| 2018/0176324 | A1* | 6/2018 | Kumar ................. H04L 67/025 |
| 2018/0285252 | A1* | 10/2018 | Kwon ................. G06F 12/0848 |
| 2018/0365167 | A1* | 12/2018 | Eckert ................. G06F 12/1036 |
| 2019/0042437 | A1* | 2/2019 | Guim Bernat ....... G06F 11/3034 |
| 2020/0136943 | A1* | 4/2020 | Banyai .................... H04L 43/20 |
| 2020/0226066 | A1* | 7/2020 | Shifer ................. G06F 12/0292 |
| 2020/0319696 | A1* | 10/2020 | Kumar ................. G06F 1/3287 |
| 2020/0333980 | A1* | 10/2020 | Lim ................. G11C 11/40611 |
| 2021/0104462 | A1* | 4/2021 | Lee .................... H01L 23/53257 |
| 2021/0245047 | A1* | 8/2021 | Dharmapurikar ....... A63F 13/77 |
| 2021/0318929 | A1* | 10/2021 | Guim Bernat ........ G06F 11/106 |
| 2021/0365193 | A1* | 11/2021 | Hong ..................... G06F 3/0679 |
| 2022/0050722 | A1* | 2/2022 | Dugast ................. G06F 9/4406 |
| 2022/0197811 | A1* | 6/2022 | Ganguly ............. G06F 12/0862 |

OTHER PUBLICATIONS

L. Oden and P. Balaji, "Hexe: A Toolkit for Heterogeneous Memory Management," 2017 IEEE 23rd International Conference on Parallel and Distributed Systems (ICPADS), 2017, pp. 656-663, doi: 10.1109/ICPADS.2017.00090. (Year: 2017).*

Preeti Ranjan Panda, Nikil D. Dutt, and Alexandru Nicolau. 2000. On-chip vs. off-chip memory: the data partitioning problem in embedded processor-based systems. ACM Trans. Des. Autom. Electron. Syst. 5, 3 (Jul. 2000), 682-704. https://doi.org/10.1145/348019.348570 (Year: 2000).*

Jishen Zhao, Guangyu Sun, Gabriel H. Loh, and Yuan Xie. 2013. Optimizing GPU energy efficiency with 3D die-stacking graphics memory and reconfigurable memory interface. ACM Trans. Archit. Code Optim. 10, 4, Article 24 (Dec. 2013), 25 pages. https://doi.org/10.1145/2541228.2541231 (Year: 2013).*

Brice Goglin. 2016. Exposing the Locality of Heterogeneous Memory Architectures to HPC Applications. In Proceedings of the Second International Symposium on Memory Systems (MEMSYS '16). Association for Computing Machinery, New York, NY, USA, 30-39. https://doi.org/10.1145/2989081.2989115 (Year: 2016).*

X. Dong, Y. Xie, N. Muralimanohar and N. P. Jouppi, "Simple but Effective Heterogeneous Main Memory with On-Chip Memory Controller Support," SC '10: Proceedings of the 2010 ACM/IEEE International Conference for High Performance Computing, Networking, Storage and Analysis, 2010, pp. 1-11. (Year: 2010).*

D. Foley and J. Danskin, "Ultra-Performance Pascal GPU and NVLink Interconnect," in IEEE Micro, vol. 37, No. 2, pp. 7-17, Mar.-Apr. 2017, doi: 10.1109/MM.2017.37. (Year: 2017).*

A. Awad, A. Basu, S. Blagodurov, Y. Solihin and G. H. Loh, "Avoiding TLB Shootdowns Through Self-Invalidating TLB Entries," 2017 26th International Conference on Parallel Architectures and Compilation Techniques (PACT), 2017, pp. 273-287, doi: 10.1109/PACT.2017.38. (Year: 2017).*

Moon-Seek Chang and Kern Koh, "Lazy TLB consistency for large-scale multiprocessors," Proceedings of IEEE International Symposium on Parallel Algorithms Architecture Synthesis, 1997, pp. 308-315, doi: 10.1109/AISPAS.1997.581683. (Year: 1997).*

M.K. Kumar, S. Maass, S. Kashyap, J. Veselý, Z. Yan, T. Kim, A. Bhattacharjee, and T. Latr: Lazy Translation Coherence. In Proceedings of the Twenty-Third International Conference on Architectural Support for Programming Languages and Operating Systems (ASPLOS '18). (Year: 2018).*

Steffen Maass, Mohan Kumar Kumar, Taesoo Kim, Tushar Krishna, and Abhishek Bhattacharjee. 2020. ECOTLB: Eventually Consistent TLBs. ACM Trans. Archit. Code Optim. 17, 4, Article 27 (Dec. 2020), 24 pages. https://doi.org/10.1145/3409454 (Year: 2020).*

Amit, Nadav. "Optimizing the {TLB} Shootdown Algorithm with p. Access Tracking." In 2017 USENIX Annual Technical Conference (USENIX ATC 17), pp. 27-39. 2017. (Year: 2017).*

M. Oskin and G. H. Loh, "A Software-Managed Approach to Die-Stacked DRAM," 2015 International Conference on Parallel Architecture and Compilation (PACT), 2015, pp. 188-200, doi: 10.1109/PACT.2015.30. (Year: 2015).*

L. Caviglione and F. Davoli, "Using P2P overlays to provide QOS in service-oriented wireless networks," in IEEE Wireless Communications, vol. 16, No. 4, pp. 32-38, Aug. 2009, doi: 10.1109/MWC.2009.5281253. (Year: 2009).*

Asai, R., "MCDRAM As High-Bandwidth Memory (HBM) In Knights Landing Processors: Developer's Guide," Colfax International, May 11, 2016, http://colfaxresearch.com/.

* cited by examiner

COMBINED ON-PACKAGE AND OFF-PACKAGE MEMORY SYSTEM

BACKGROUND

Recently, high bandwidth memory access is enabled by coupling a processor to a stack of memory dies and a buffer through an interposer. Wires fabricated in the interposer transmit signals between the processor and buffer that is stacked with the memory die. The interposer provides increased density and speed compared with conventional printed traces or wire bond connections, so that more bits of memory may be accessed in parallel at high speed. However, even when stacked memory is coupled to a processor using an interposer, artificial intelligence, machine learning, and other compute intensive applications may still be memory bandwidth limited and also require even more memory capacity than can be provided by the stack of memory dies. There is a need for addressing these issues and/or other issues associated with the prior art.

SUMMARY

Embodiments of the present disclosure relate to a combined on-package and off-package memory system. A custom base-layer including one or more dedicated interfaces to off-package memories is directly coupled to an on-package processor and on-package memories. A single device package encloses the processor, the custom base-layer, a package substrate, and at least one memory stack. The custom base-layer includes memory management logic between the processor and memories (both off and on package) to steer requests. The memories are exposed as a combined memory space having greater bandwidth and capacity compared with either the off-package memories or the on-package memories alone. The memory management logic services memory access requests while maintaining quality of service (QoS) to satisfy bandwidth requirements for each processing workload. The memory may be organized into different pools that include any combination of the on and/or off package memories to satisfy different bandwidth requirements. The memory management logic also manages data migration between the different pools.

In contrast to conventional systems, such as those described above, the memory management logic exposes the combined memory space to the processor, providing a unified interface for accessing more memory capacity with greater bandwidth and at high speeds. The memory management logic may also off-load address translation and mapping operations from the processor. The combined on-package and off-package memory system provides high memory bandwidth for artificial intelligence, machine learning, and other compute intensive applications and also provides greater memory capacity than can be provided by the stacked memory dies alone.

A method and system are disclosed for a combined on-package and off-package memory system. In an embodiment, memory access requests are received from a processor that is coupled to a base layer within a package and the memory access requests are processed by memory management logic fabricated within the base layer that is coupled between the processor and a memory system. The memory management logic may transmit a first portion of the memory access requests to at least one memory stack that is enclosed within the package and directly coupled to the base layer and transmits a second portion of the memory access requests to at least one memory device that is external to the package and coupled to the package by a first connection. The memory access requests in the first and second portions may be interleaved.

In an embodiment, a processor is coupled to a base layer within a package that encloses the processor and the base layer, and the base layer comprises memory management logic and is coupled between the processor and a memory system. The memory management logic processes memory access requests received from the processor. The memory system comprises at least one memory stack that is enclosed within the package and is directly coupled to the base layer and at least one memory device that is external to the package and is coupled to the package.

BRIEF DESCRIPTION OF THE DRAWINGS

The present systems and methods for a combined on-package and off-package memory system are described in detail below with reference to the attached drawing figures, wherein.

DETAILED DESCRIPTION

Systems and methods are disclosed related to a combined on-package and off-package memory system that enables both capacity-optimized and bandwidth-optimized dynamic random access memory (DRAM) devices to be used in a synergistic way to achieve higher capacity and higher bandwidth to a processor compared with conventional solutions. This allows legacy workloads that are only bandwidth-sensitive to continue using the high-bandwidth HBM, but also allows newer capacity-constrained workloads to be deployed on the processor and benefit from increased memory bandwidth compared with conventional solutions. Bandwidth sensitive workloads may also benefit from increased memory bandwidth when a unified memory pool is provided by a combination of the HBM and at least a portion of the off-package memory system compared a memory pool including only the HBM.

Traditional compute-to-capacity assumptions that were guided by graphics and high performance computing (HPC) workloads are being transformed by datacenter applications. Emerging datacenter applications demand higher memory capacity from processing systems than what can usually be provided by scaling high bandwidth memory (HBM) die density, number of layers, or the number of HBM sites in a single package. More specifically, recent applications such as recommender systems and extract, transform, and load (ETL) operations for preparing data for execution of data science and analytics pipelines require fast access to terabytes of memory capacity.

Other than scaling HBM capacity, traditional techniques to provide a larger physical address space for a processor access peer or host memory over an interface having lower bandwidth compared with the local HBM. More recently, processors include a serial interface that connects to an off-chip buffer that is coupled to double data rate (DDR) dual in-line memory modules (DIMMs), essentially providing an expansion of the die-edge to enable high capacity. The processor interface to the off-chip buffer is separate from an interface with the local HBM, so that the processor is burdened with maintaining information for sending requests to the correct interface.

Figure 1A:
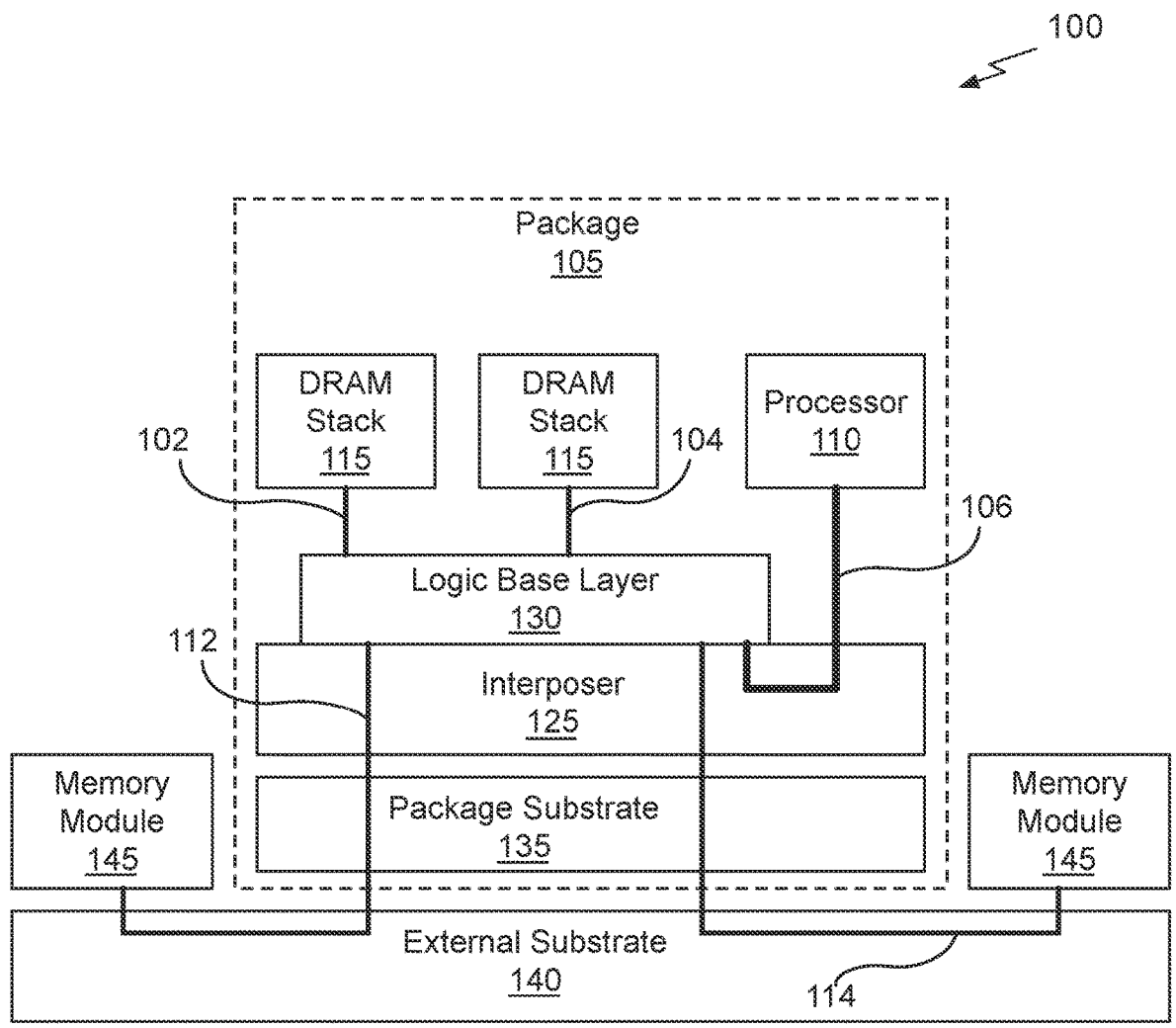
FIG. 1A illustrates a block diagram of an example processing system including a processor coupled to a combined on-package and off-package memory system suitable for use in implementing some embodiments of the present disclosure.

FIG. 1A illustrates a block diagram of an example processing system 100 including a processor 110 coupled to a combined on-package and off-package memory system suitable for use in implementing some embodiments of the present disclosure. It should be understood that this and other arrangements described herein are set forth only as examples. Other arrangements and elements (e.g., machines, interfaces, functions, orders, groupings of functions, etc.) may be used in addition to or instead of those shown, and some elements may be omitted altogether. Further, many of the elements described herein are functional entities that may be implemented as discrete or distributed components or in conjunction with other components, and in any suitable combination and location. Various functions described herein as being performed by entities may be carried out by hardware, firmware, and/or software. For instance, various functions may be carried out by a processor executing instructions stored in memory. Furthermore, persons of ordinary skill in the art will understand that any system that performs the operations of the processor 110 coupled to a combined on-package and off-package memory system is within the scope and spirit of embodiments of the present disclosure.

In an embodiment, the processor 110 is a graphics processing unit (GPU). The processor 110 is coupled to both on-package DRAM stacks 115 and off-package memory modules 145 through an interposer 125. In an embodiment, each DRAM stack 115 includes memory dies that are stacked on top of an HBM controller 120 that is vertically coupled to each die in the DRAM stack 115 to form an HBM stack. The HBM stack(s) are enclosed within a package 105 along with the processor 110. In an embodiment, the DRAM stacks 115 are each coupled to the corresponding HBM controllers 120 by a parallel DRAM bus. In an embodiment, at least one HBM stack is included in the package 105.

In contrast with the on-package HBM stacks that are enclosed within the package 105, the memory modules 145 are external to the package 105. In an embodiment, each off-package memory module 145 includes at least one low power (LPDDR) or DDR memory device, die, or component. In an embodiment, each memory module 145 includes a buffer (e.g., high-speed serial to LP5 buffer or interface) that is coupled between a bus or connection 112 or 114 and DRAM memory components. In an embodiment, the buffer within each memory module 145 is coupled to one or more DRAM memory components via a parallel bus. In an embodiment, each buffer within a memory module 145 is coupled by a parallel DRAM bus to at least one stack of memory, such as four stacks of 4 GB, for a total off-package memory capacity of 16 GB within each memory module 145. In an embodiment, the memory module 145 comprises a DIMM. In an embodiment, the connections 112 and 114 are high-speed serial links, such as JEDEC DDR or LPDDR that are connected to the memory modules 145. In an embodiment, the high-speed serial links provided by each of the connections 112 and 114 provide a data transfer rate or bandwidth of 128 GB/sec in each direction.

The processor 110 is directly coupled to a logic base layer 130 through an connection 106 that is capable of supporting more bandwidth than is provided by either the off-package memory modules 145 or the HBM stacks. In an embodiment, the processor connection 106 is capable of supporting a sum of the bandwidths provided by the off-package memory modules 145 and the HBM stacks. More specifically, within the package 105, short-reach interposer signaling may be used between the processor 110 and the logic base layer 130. In an embodiment, the logic base layer 130 is a custom silicon layer that includes fabricated logic. The interposer 125 provides conductive connections for transmitting signals between the processor 110 and the logic base layer 130 and between each memory module 145 and the logic base layer 130. Signals transmitted between the processor 110 and the logic base layer 130 do not exit the package 105 and may be transmitted through conductive paths fabricated in the base layer 125. Similarly, the connections 102 and 104 between the on-package HBM controllers 120 and the logic may also be transmitted through conductive paths fabricated in the base layer 125. As shown in FIG. 1A, the HBM controllers 120 are directly coupled to the logic base layer 130 by connections 102 and 104. In an embodiment, the connections 102 and 104 are each parallel DRAM buses.

The interposer 125 is positioned on a top surface of a package substrate 135 and an opposing (bottom) surface of the package substrate 135 is physically and electrically coupled to an external substrate 140. In an embodiment, the package 105 is a ball grid array and electrical signals are transmitted through conductive solder balls that are positioned between the package substrate 135 and the external substrate 140. The dedicated connections 112 and 114 between each of the off-package memory modules 145 and the logic base layer 130 transmit signals through conductive paths fabricated in the interposer 125, the package substrate 135, and the external substrate 140. In an embodiment, the external substrate 140 is a printed circuit board and the conductive paths are traces. In an embodiment, the memory modules 145 are each packaged in ball grid arrays that are mounted onto the external substrate 140. In an embodiment, the conductive paths for the connections 112 and 114 within the interposer 125 and the package substrate include through silicon vias. The dedicated connections 112 and 114 directly couple the memory modules 145 to the logic base layer 130.

The logic base layer 130 aggregates memory capacity provided by both the DRAM stacks 115 and the memory modules 145, relieving the processor 110 from most if not all memory mapping and management operations. Logic circuitry fabricated in the logic base layer 130 performs the aggregation, memory mapping, and management operations. The logic base layer 130 includes separate interfaces for each of the on-package processor 110, the on-package HBM stack(s), and the off-package memory module(s) 145. In an embodiment, each HBM stack has a 24 GB capacity and provides memory access (any combination of read and write accesses) bandwidth of 512 GB/sec. In an embodiment, each memory module 145 provides an additional off-package memory capacity of 64 GB and each of the connections 112 and 114 provides additional memory access bandwidth of 128 GB/sec for the processor 110. Assuming a configuration with a single DRAM stack 115 and two memory modules 145, the total memory capacity is 152 GB and 768 GB/sec of memory bandwidth is provided to the processor 110 by the logic base layer 130 aggregation of the memory bandwidth for the combination of on and off package memory.

In general, the bandwidth available for the on-package memories is greater compared with the off-package memories and the capacity available for the on-package memory is less compared with the off-package memories. The logic base layer 130 implements support for both on and off package memories, providing the high memory bandwidth needed by legacy applications, while also satisfying the high memory capacity requirements of datacenter and machine learning applications.

Compared with conventional central processing unit (CPU) solutions that provide only off-package memory implementations, the base layer provides a combination of on and off package memories. Compared with conventional GPU solutions that provide on-package memory and rely on off-package low bandwidth host memory for additional capacity, the logic base layer 130 provides a single unified memory with improved bandwidth. In an embodiment, the logic base layer 130 includes memory management logic needed for transparent memory space accesses by the processor 110, including providing configurable memory spaces to satisfy bandwidth and capacity requirements for different workloads.

More illustrative information will now be set forth regarding various optional architectures and features with which the foregoing framework may be implemented, per the desires of the user. It should be strongly noted that the following information is set forth for illustrative purposes and should not be construed as limiting in any manner. Any of the following features may be optionally incorporated with or without the exclusion of other features described.

Figure 1B:
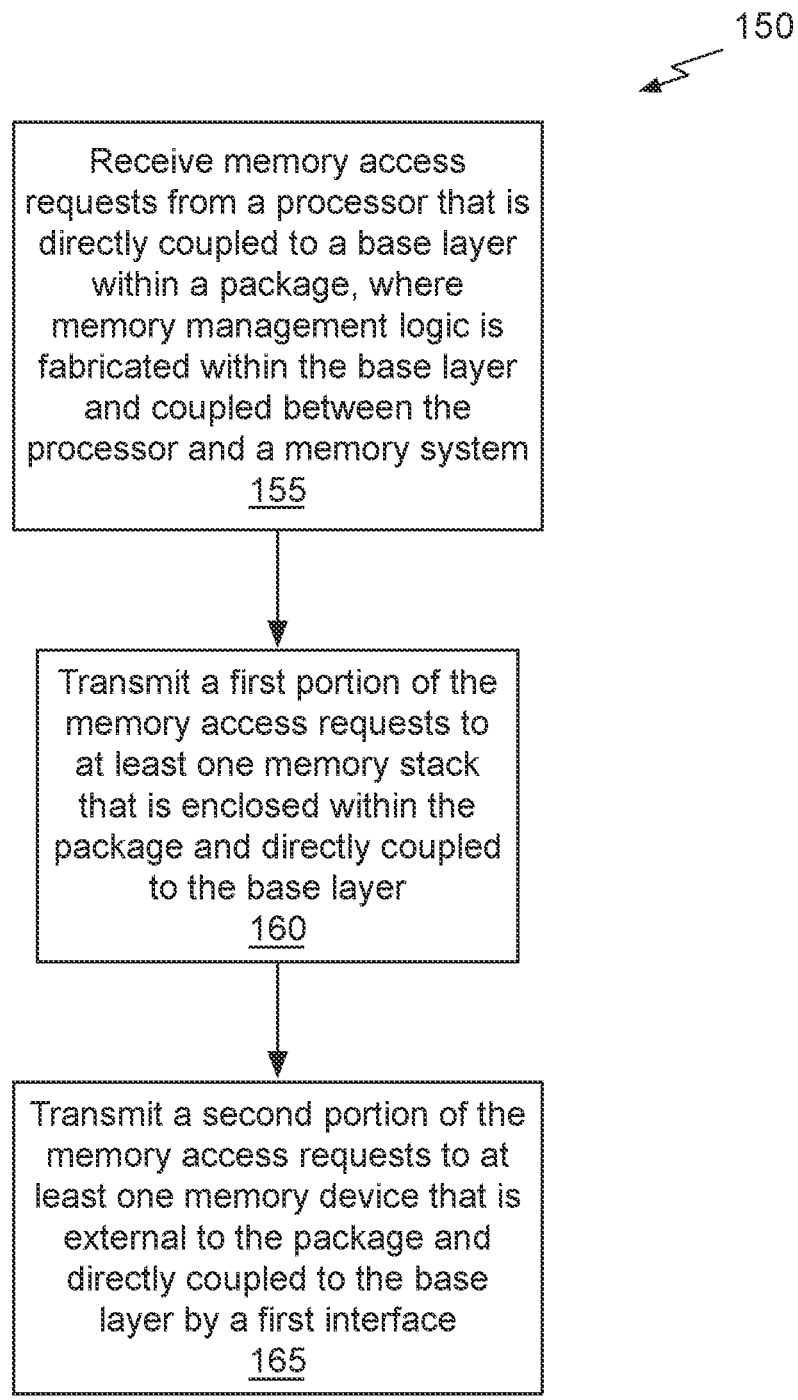
FIG. 1B illustrates a flowchart of a method for processing memory access requests for a combined on-package and off-package memory system, in accordance with an embodiment.

FIG. 1B illustrates a flowchart of a method 150 for processing memory access requests for a combined on-package and off-package memory system, in accordance with an embodiment. Each block of method 150, described herein, comprises a computing process that may be performed using any combination of hardware, firmware, and/or software. For instance, various functions may be carried out by a processor executing instructions stored in memory. The method may also be embodied as computer-usable instructions stored on computer storage media. The method may be provided by a standalone application, a service or hosted service (standalone or in combination with another hosted service), or a plug-in to another product, to name a few. In addition, method 150 is described, by way of example, with respect to the processor 110 coupled to the combined on-package and off-package memory system of FIG. 1A. However, this method may additionally or alternatively be executed by any one system, or any combination of systems, including, but not limited to, those described herein. Furthermore, persons of ordinary skill in the art will understand that any system that performs method 150 is within the scope and spirit of embodiments of the present disclosure.

At step 155, memory access requests are received from a processor that is directly coupled to a base layer within a package and the memory access requests are processed by memory management logic fabricated within the base layer that is coupled between the processor and a memory system. In an embodiment, the base layer is logic base layer 130 and the processor is the processor 110. In an embodiment, the processor 110 is coupled to the memory system that comprises the logic base layer 130, at least one HBM stack, and at least one off-package memory device, such as the memory module 145. In an embodiment, a capacity of the at least one memory stack is less than a capacity of the at least one memory device. In an embodiment, a data transfer rate of the at least one memory stack is greater than a data transfer rate of the at least one memory device. In an embodiment, the logic base layer 130 comprises the memory management logic.

At step 160, the memory management logic transmits a first portion of the memory access requests to at least one memory stack that is enclosed within the package and directly coupled to the base layer. In an embodiment, in response to a first memory access request, data stored in the at least one memory stack and the at least one memory device are transmitted between the processor and the base layer through the connection 106. In an embodiment, the memory management logic translates each address associated with a memory access request according to an interface mapping to transmit the memory access request to one of the at least one memory stack or the at least one memory device. In an embodiment, the interface mapping is stored within the logic base layer 130 and maps each address associated with an access request to one of the interfaces coupled to connections 102, 104, 112, and 114. In an embodiment, the logic base layer 130 translates an address to identify one of the interfaces and transmits at least a portion of the address or translated address on the identified interface.

At step 165, the memory management logic transmits a second portion of the memory access requests to at least one memory device that is external to the package and coupled to the base layer by a first interface. In an embodiment, the at least one memory device is coupled to the base layer by a first interface and the memory system further comprises at least one additional memory device that is external to the package and coupled to the base layer by a second interface that is separate from the first interface. In an embodiment, a far memory pool or space includes only locations in the at least one memory device. In an embodiment, a near memory pool includes first locations in the at least one memory stack and second locations in the at least one memory device. In an embodiment, the first locations and the second locations are interleaved within the near memory pool according to an address mapping performed by the memory management logic.

In an embodiment, data is simultaneously transmitted between the memory management logic and both the at least one memory stack and the at least one memory device. For example, in response to a memory read request, the data is simultaneously transmitted from at least one of the DRAM stacks 115 and at least one of the memory modules 145 to logic base layer 130. In another example, in response to a memory write request, the data is simultaneously transmitted from the logic base layer 130 to at least one of the DRAM stacks 115 and at least one of the memory modules 145. In an embodiment, every memory access request for the DRAM stacks 115 and the memory modules 145 is processed by the logic base layer 130.

Figure 2A:
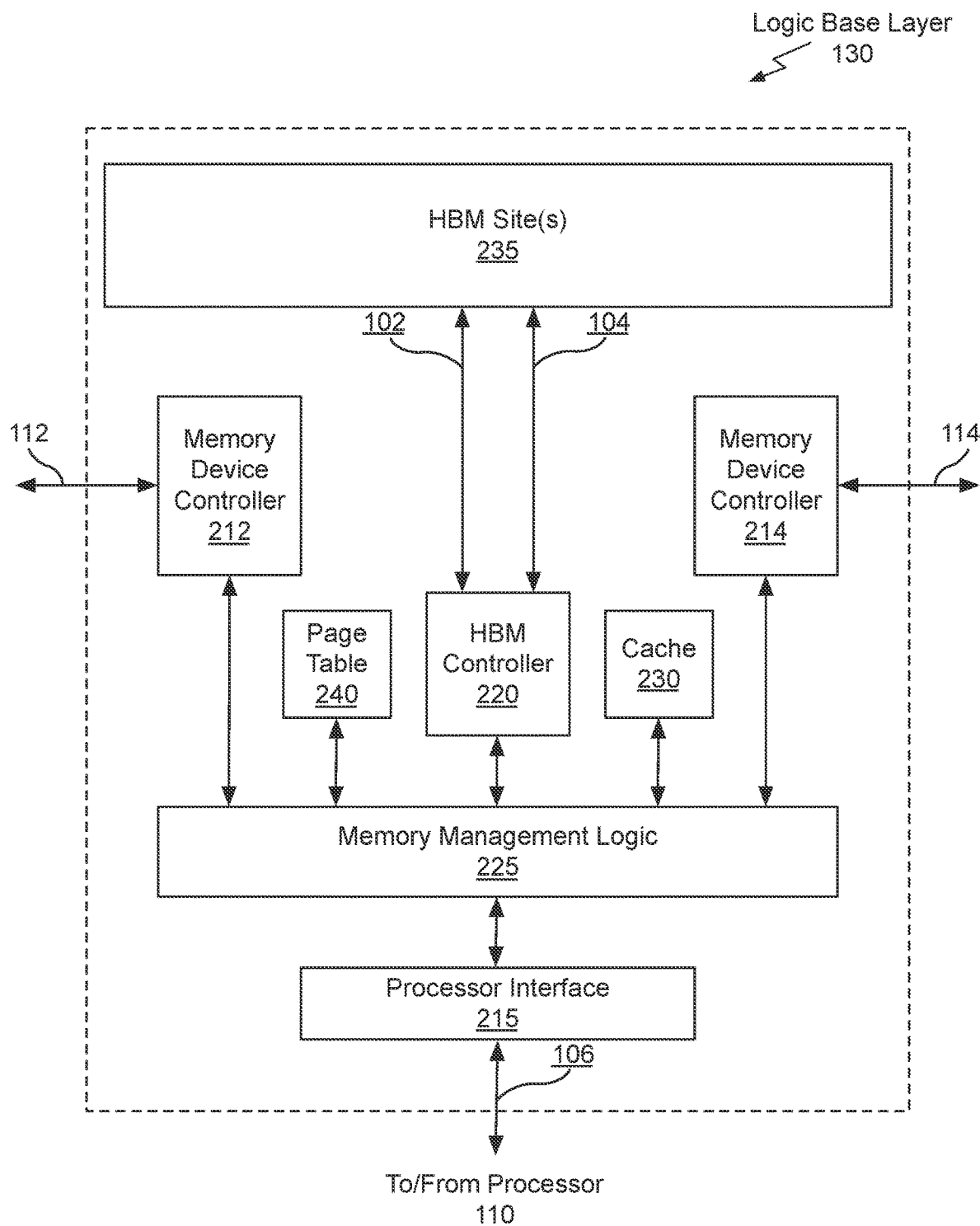
FIG. 2A illustrates a block diagram of an example logic base layer suitable for use in implementing some embodiments of the present disclosure.

FIG. 2A illustrates a block diagram of an example logic base layer 130 suitable for use in implementing some embodiments of the present disclosure. The logic base layer 130 includes an HBM controller 220 that interfaces to the connections 102 and 104 for the on-package memories that are coupled to the logic base layer 130 at HBM sites 235. The logic base layer 130 also includes memory device controllers 212 and 214 that interface, respectively, to the connections 112 and 114 to the off-package memory that includes memory modules 145. The logic base layer 130 also includes a processor interface 215 that directly couples the logic base layer 130 to the processor 110 through the connection 106. In an embodiment, the logic base layer 130 includes one or more additional processor interfaces 215 that are coupled to one or more additional processors that may be the same as processor 110 or different. In an embodiment, the logic base layer 130 includes at least one additional interface that is coupled to one or more other devices that access a combination of the on and off package memory. Any processor or device that accesses the on and off package memory issues requests to the logic base layer 130 as there is no alternate path to/from either the HBM stacks or the off-package memory.

Memory management logic 225 steers memory access requests received from the processor 110 via a processor interface 215 to the correct memory according to address mapping information that may be stored in a page table 240. The address mapping information may include interface mappings and be used to translate addresses received from the processor 110 to interface specific addresses. In an embodiment, the interface mapping information may also be stored in the page table 240 or may be stored separately from the address mapping information. Therefore, the processor 110 does not need to be aware of the different memories and may be relieved of performing memory translations for the on package and off package memories. The memory management logic 225 also responds to requests received from the processor 110 via the processor interface 215.

The memory management logic 225 routes each request for an address mapped to the off-package memory module 145 coupled to the memory device controller 212 by the connection 112. Similarly, the memory management logic 225 routes each request for an address mapped to the off-package memory module 145 coupled to the memory device controller 214 by the connection 114. In an embodiment, the memory device controllers 212 and 214 translate addresses received from the memory management logic 255, as needed, to access locations in the memory module(s) 145. In an embodiment, address mapping information specific to the interfaces 112 and 114 is stored in the memory device controllers 212 and 214. The memory device controllers 212 and 214 may also implement any communication protocols specified for the memory modules 145. In an embodiment, the memory device controllers 212 and 214 are not fabricated in the logic base layer 130 and are instead located off-package and integrated into each of the memory modules 145 or located between the package 105 and the respective memory module 145.

The memory management logic 225 routes each request for an address mapped to the on-package HBM stacks coupled to the interfaces 102 and 104 through an HBM controller 220. In an embodiment, the HBM controller 220 translates addresses received from the memory management logic 225, as needed, to access locations in the HBM stacks. The HBM controller 220 may also implement any communication protocols specified for the HBM stacks.

To implement a variety of different memory system configurations, the base layer can be redesigned to support different memory devices and/or to remove or add additional interfaces without redesigning or modifying the processor 110. Furthermore, legacy applications that rely on the bandwidth provided by the HBM stack can be supported without any modifications to the legacy application by allocating a memory pool in locations in the DRAM stack(s) 115 to the legacy application. An application that is bandwidth limited and benefits from some increased memory capacity, may use a near memory pool that is allocated all of the DRAM stack(s) 115 and all of the bandwidth of the off-package memory resulting in, for example, 50% more bandwidth and 50% more capacity than HBM stack alone. Such an allocation would leave no guaranteed available far memory pool bandwidth and the bulk of the off-package memory capacity would not be utilized, but may enable the best performance for some "legacy" applications. Applications that may benefit from higher memory capacity that is available using only the on-package HBM stack(s) may be access more capacity using a memory pool that is allocated locations in the off-package memory or a combination of the off-package memory and the on-package HBM stack(s).

The combined memory pool provided by the on and off package memories is exposed to the processor 110 as a unified memory space. The combined memory pool may be divided into a high-capacity far-memory (with lower bandwidth) pool and a lower-capacity near-memory (with higher bandwidth) pool. In one embodiment, the application or the system software is made aware of the two pools of memory and is responsible for paging data in-and-out of the near memory and/or partitioning the data appropriately. In another embodiment, the management of the near and far memory is handled by the memory management logic 225 and is transparent to the applications and the processor 110.

In an embodiment, the near memory pool includes only the on-package HBM stack(s) and the far memory pool includes only the off-package memory. In an embodiment, the near-memory pool includes the on-package HBM stack(s) and at least a "carve out" portion the off-package memory. In an embodiment, the far memory pool includes the off-package memory that is not included in the near memory pool. In an embodiment, the address mapping for memory allocations in the near memory pool may interleave locations in the on and off package memories to satisfy capacity and bandwidth requirements, as described in conjunction with FIG. 3A. Processing workloads that are not memory capacity constrained may benefit from the additive bandwidth of provided by the off-package memory in the interleaved mode. Capacity focused workloads may benefit from the additional capacity provided by the off-package memory. Compared with conventional solutions that provide additional capacity using peer or host memory, the off-package memory that is directly accessed by the processor 110 through the logic base layer 130 is higher bandwidth.

In an embodiment, a migration engine is included in the logic base layer 130 to move or copy data between different locations in the memory system in a manner that is transparent to the processor 110. In an embodiment, migration of data between near and far memory does not increase traffic on the processor interface 215. Therefore, data migration is efficient in terms of both power consumption and processor memory bandwidth. In an embodiment, the migration engine is implemented by the memory management logic 225. Various policies may be used to perform migration. For example, frequently accessed data may migrate from the far to near memory through a cache 230 without interrupting request servicing and/or incurring slowdowns related to conventional management events, such as translation lookaside buffer (TLB) shootdowns. In an embodiment, the cache 230 stores data only for addresses that are mapped to the far memory.

The migration process can be triggered either by explicit requests generated by the processor 110 as a result of a program instruction or can be triggered by a different mechanism. In an embodiment, migration may be triggered based on access frequency. In an embodiment, migration is triggered based on access frequency within a given time window. In an embodiment, migration is triggered based on an access pattern, such as migrating a page that is located between two pages which have already been migrated. In an embodiment, migration is triggered based on analyzing addresses in an access stream to identify pages to migrate.

In an embodiment, transfer of data between the near and far memories may be accomplished at a granularity, such as a page size, that is programmed or fixed. In an embodiment, each cache line in the cache 230 stores data for a page of memory and each location in the page is stored in a separate sector within the cache line. For example, in an embodiment, a sector is 32 bytes of data and a cache line stores 2048 sectors. The memory management logic 225 may track the number of valid sectors in a cache line and, when the number is greater than a threshold value, the memory management logic 225 may migrate the page associated with the cache line into the near memory. Valid sectors store data that is also stored in the corresponding memory location.

During the transfer, the memory management logic 225 may track the locations within the page under migration. As locations are migrated into the invalid sectors of the cache line, the page table is updated and any requests for valid sectors are serviced by the cache 230 while requests for invalid sectors that have not yet been migrated are serviced by loading data from the far memory into the corresponding invalid sector. While the migration is underway, the memory management logic 225 may continue to process requests received from the processor 110—even when the request accesses a location that is being migrated.

In an embodiment, the total memory capacity is a sum of the on and off package memory referred to as exclusive mode. In contrast, for an inclusive mode, the far memory functions as a backing store for the near memory. The total memory capacity for the inclusive mode is the capacity of the far memory.

The cache 230 may be used to perform the migration. For the inclusive mode, when migration is triggered for a memory page, the memory management logic 225 loads the invalid sectors into the cache line assigned to the memory page while continuing to service new requests. If the memory page is not present in the cache, the memory management logic 225 first assigns a cache line to the memory page and then loads the sectors. In an embodiment, the cache line is locked in the cache while the invalid sectors are loaded and when the entire cache line is valid (e.g., the cache line is "full"), the memory management logic 225 updates the page table 240 accordingly. For example, the location of the migrated page may be changed to a location in the near memory and the cache line may be marked as "dirty". In an embodiment, the memory management logic 225 stores interface information for determining routing for requests and the interface information is updated to associate the address for the migrated page with a near memory interface. Once the migration is completed, the memory management logic 225 may unlock the cache line and, if needed, the cache line may be evicted.

For the exclusive mode, all of the near and far memory pool is used the cache 230 may be used to "swap" data between the near and far memory pools. A first page of data being migrated from far to near memory may be temporarily stored in the cache 230 while locations in the far memory storing the first page are overwritten with a second page of data being migrated from second locations in the near memory to the far memory. As previously described, the first page may be associated with a cache line, and the memory management logic 225 may load the invalid sectors into the cache line while continuing to service new requests. Once the entire cache line is valid, the first page of data may then be stored to the second locations in the near memory and the memory management logic 225 updates the page table 240 to indicate that the second page is in the far memory and the first page is in the near memory. Essentially, the first page is "swapped" with the second page by using the cache 230 as temporary storage. In another embodiment, the second page of data may be stored in the cache 230 and the first page of data may be stored directly to the second locations in the near memory. Then the second page of data may be read from the cache 230 and stored in the far memory and the memory management logic 225 may update the page table 240 accordingly.

When unused space is available in the near memory, the first page of data may be stored directly to the second locations in the near memory without first being stored in the cache 230. Once the first page of data is stored in the near memory, the memory management logic 225 updates the page table 240 accordingly. In an embodiment, when the near memory includes at least a portion of the off-package memory, a portion of the data in the off-package portion of the near memory is not migrated to the far memory by moving the portion. Instead, assignment of the locations in the off-package memory storing the portion of the data is changed from the near memory to the far memory. Therefore, only the remaining data stored in the on-package memory needs to be moved to the far memory to complete the near to far memory migration.

In the context of the following description, a page of data may exist in one of three states—resident in an on-package memory, resident in an off-package memory, or under migration. When the memory management logic 225 determines a page is under migration, the current location of the data associated with a particular sector in the cache line storing the page is determined. When the sector is valid, the request may be completed. Otherwise, the request may be completed once the sector becomes valid. In an embodiment, the memory management logic 225 stalls processing of the request until the migration is completed.

Figure 2B:
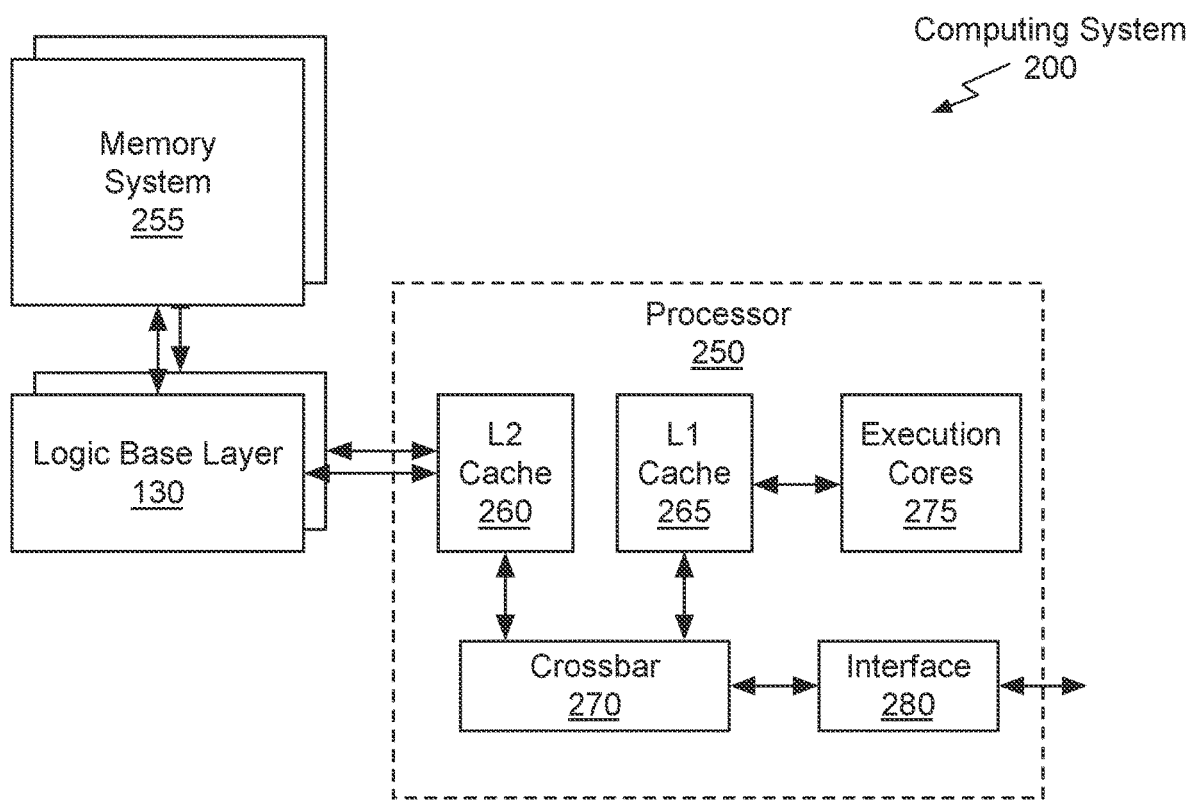
FIG. 2B illustrates a computing system that includes the combined on-package and off-package memory system, in accordance with an embodiment.

FIG. 2B illustrates a computing system 200 that includes the combined on-package and off-package memory system 255, in accordance with an embodiment. The computing system 200 includes a processor 250, the logic base layer 130, and the memory system 255. The memory system 255 comprises on-package and off-package memories, such as at least one HBM stack (e.g., HBM controller 120 and DRAM stack 115) and at least one memory module 145, respectively.

In an embodiment, the processor 250 is coupled to multiple logic base layers 130 and the processor 250 includes separate interfaces 106 to each logic base layer 130. The multiple logic base layers 130 may be fabricated in a single die or multiple dies and coupled to separate memory systems 255. In an embodiment, links between the logic base layers 130 are fabricated within the interposer 125. The processor 250 routes requests to the correct interface 106 and logic base layer 130 based on an address to interface mapping. In an embodiment, each logic base layer 130 is coupled to a single DRAM stack 115 and two memory modules 145, providing a total memory capacity of 152 GB and 768 GB/sec of memory bandwidth. When six logic base layers 130 and six memory systems 255 are included in the computing system 200, a total memory capacity of 912 GB is provided by the combination of on and off package memory and 4.5 TeraBytes/sec of bandwidth is provided to the processor 110 by the six logic base layers 130 aggregation of the memory bandwidth for the combination of on and off package memory.

The processor 250 may be the processor 110 and includes an interface 280 that is coupled to at least one additional device that is external to a package enclosing at least the processor 250, the logic base layers 130, and the on-package portion of the memory systems 255. In an embodiment, the at least one additional device is additional memory that may be accessed by the processor 250. In a conventional system, the at least one additional device is used to increase the memory capacity when only an on-package HBM stack is available. However, in contrast with the off-package memory that is included in the memory system 255, the at least one additional device is not coupled to the processor 250 through the same interface as the on-package HBM stack(s).

The processor 230 may also include one or more units comprising storage, such as L2 cache 260 and L1 cache 265, a crossbar 270 interconnect, and/or processing or execution cores 275. In an embodiment, the processor 250 may include multiple L2 caches 260. Each L2 cache 260 may be separately connected to a dedicated logic base layer 130. When multiple memory systems 255 are included in the computing system 200, the processor 250 maintains mapping information to determine which one of the memory systems 255 each request is transmitted to. In an embodiment, the processor 250 may specify whether data is stored in near or far memory, but the processor 250 does not need to track or control mapping of addresses within a particular memory system 255. Based on requirements specified for data storage, the logic base layer 130 provides and maintains the mapping information for data stored in the memory system 255.

Although data stored in the memory system 255 may be cached in the L2 cache 260 and/or L1 cache 265, migrations of data within each of the memory systems 255 (between near and far memory pools) are performed by the logic base layers 130 without transferring data between the logic base layers 130 and the processor 250. The logic base layers 130 and memory systems 255 enable both higher memory capacity and higher memory bandwidth for the processor 250 compared with using only on-package memory.

In an embodiment, at least a portion of the processor 250 is included in a virtual machine. In an embodiment, the processor 250 is part of a server or data center, and data stored in the memory system is streamed to a user device. In an embodiment, the processor 250 generates data used for training, testing, or certifying a neural network employed in a machine, robot, or autonomous vehicle. In an embodiment, at least a portion of the processor 250 is included in a cloud computing environment.

Figure 3A:
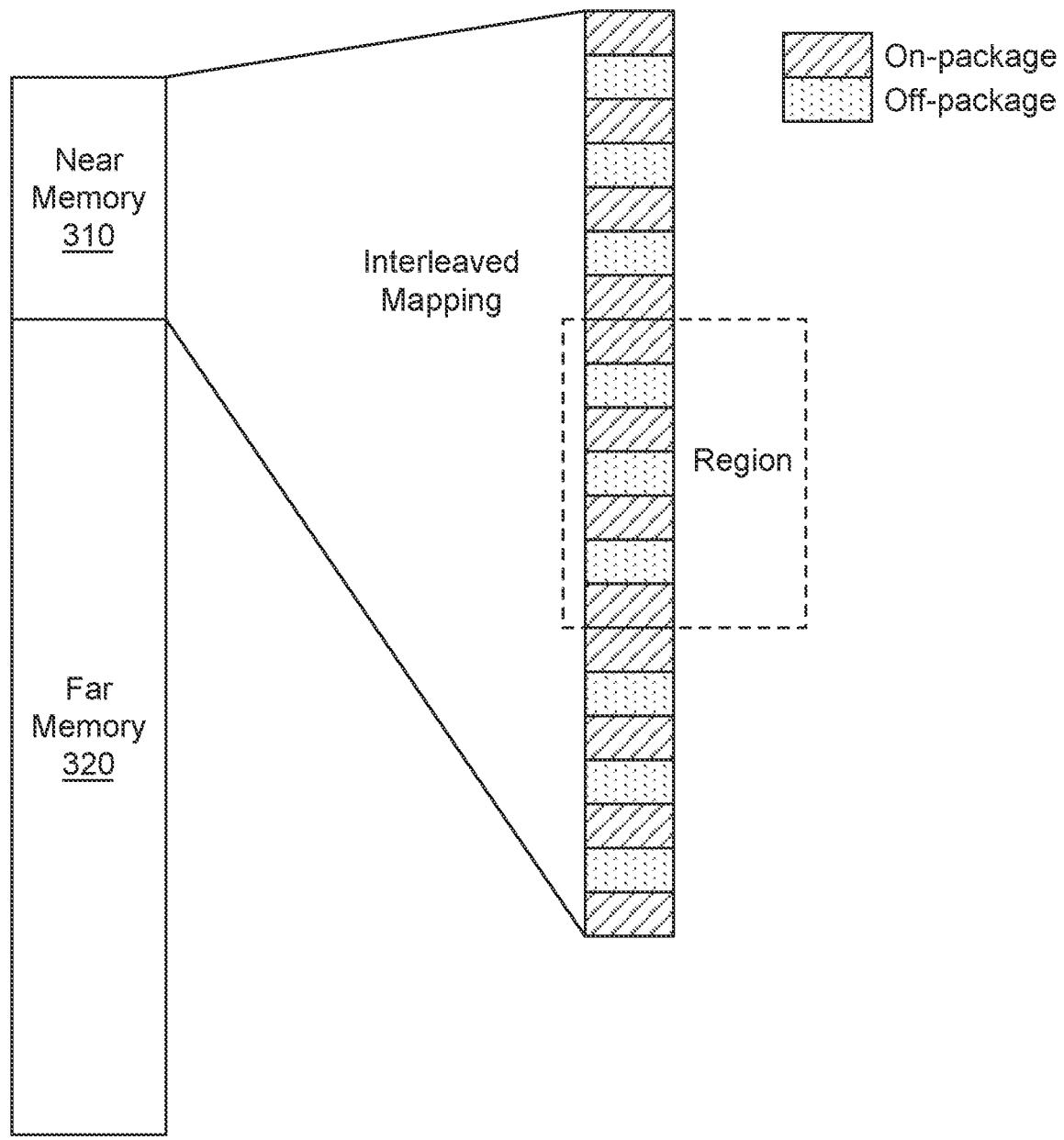
FIG. 3A illustrates a conceptual diagram of near and far memory mapping suitable for use in implementing some embodiments of the present disclosure.

FIG. 3A illustrates a conceptual diagram of near and far memory mapping suitable for use in implementing some embodiments of the present disclosure. In an embodiment, the on-package memory and off-package memory included in the memory system 255 is partitioned into near memory 310 and far memory 320. In an embodiment, the entire near memory 310 includes all of the on-package memory and none of the off-package memory. In an embodiment, the entire far memory 320 includes all of the off-package memory and none of the on-package memory. When the near memory 310 is exclusively the on-package memory and the far memory 320 is exclusively the off-package memory, the memory bandwidth provided by each pool is easily determined. Applications and/or processing workloads may be allocated memory in the different pools based on memory bandwidth requirements and/or memory capacity requirements. Within each pool, the addresses may be mapped (e.g., striped) across the different memory modules 145 and HBM stack(s) at a granularity of a cache line or other amount.

In an embodiment, the near memory 310 includes all of the on-package memory and a portion of the off-package memory and the remaining off-package memory is included in the far memory 320. In an embodiment, an interleaved mapping is used for the near memory 310 so that, within an address range (linear or swizzled), locations in the off-package memory are interleaved with locations in the on-package memory. In an embodiment, the interleaving granularity is 64 Kbytes, so that an interleaved region shown in FIG. 3A includes seven interleaved 64 Kbyte portions of memory. The interleaving ensures that when a range of addresses is accessed, the memory bandwidth may be higher compared with accessing only the on-package memories. In an embodiment, the interleaving granularity is a power-of-two value value, $2^n$, where n is an integer. In an embodiment, the interleaving granularity is finer than 64 Kbytes, such as a value 512B-1 Kbytes. In another embodiment, the interleaving granularity is greater than 64 Kbytes.

The memory bandwidth may be higher because the logic base layer 130 enables simultaneous traffic between the processor 110 or 250 and both the on-package memories and the off-package memories. Therefore, interleaving off-package memory locations with the on-package memory locations will increase the bandwidth up to the point where either the off-package memory bandwidth between the memory system 255 and the logic base layer 130 is saturated or the bandwidth between the logic base layer 130 and the processor 250 is saturated. In an embodiment, within the near memory, a ratio of the off-package memory channels to the on-package memory channels equals the ratio of the aggregate bandwidth of the two different types of memory (HBM stack and off-package).

For example, when three memory modules 145 are included in the memory system, each with a separate 128 GB/sec interface (e.g., channel), the bandwidth for the off-package memories is 384 GB/sec. If the bandwidth for the on-package memories is 512 GB/sec, the aggregate bandwidth is 896 GB/sec, where the off-package memories provide 3/7 of the aggregate bandwidth and the on-package memories provide 4/7 of the aggregate bandwidth. As shown in FIG. 3A, the interleaving within the region of three off-package portions with four on-package portions is repeated for additional regions within the mapping for the near memory 310. According to the bandwidth ratios, if 16 GB of on-package memory is included in the near memory, 12 GB of off-package memory is assigned to the near memory for a total near memory capacity of 28 GB and 896 GB/sec of bandwidth. The remainder of the off-package memory is assigned to the far memory and the addresses are striped across the three memory modules 145 to provide the remaining memory capacity at a bandwidth up to 384 GB/sec that is shared with the near memory.

In another example, each pool is allocated a maximum bandwidth with the near memory receiving all of the on-package bandwidth and a portion of the off-package bandwidth. Specifically, the near memory may be allocated ⅔ of the off-package bandwidth which is 256 GB/sec of the total off-package memory bandwidth of 384 GB/sec. Overall, the aggregate bandwidth for the near memory is limited by the maximum bandwidth of the interface 215 between the logic base layer 130 and the processor 110. However, the maximum bandwidth of the interface 215 may be greater than the total bandwidth of the memory system so that the aggregate bandwidth is instead limited to the total bandwidth of the memory system. In an embodiment, the processor bandwidth provided by the interface 215 is nearly twice the on-package memory bandwidth. When the near memory is allocated ⅔ of the off-package bandwidth, the maximum bandwidth for the near memory is 768 GB/sec and 8 GB of off-package memory is assigned to the near memory, and when combined with the 16 GB of on-package memory, the total near memory capacity is 24 GB. On average, accessing the entire 8 GB of off-package memory will take the same amount of time to access as the 16 GB of on-package memory. When utilizing the maximum 768 GB/s of near memory bandwidth in this example, only 256 GB/s of off package bandwidth is used. This leaves 128 GB/s of reserved bandwidth for requests to the far memory pool. Allocating more off-package memory to increase the near memory capacity and bandwidth will decrease the reserved bandwidth available for the far memory requests.

In an embodiment, the logic base layer 130 prioritizes near memory accesses over far memory accesses to prevent the far memory requests from reducing the maximum bandwidth needed by the portion of the off-package memory that is included in the near memory pool. In an embodiment, the accesses are arbitrated according to maximum bandwidths associated with the near and far memory pools and when there are no far memory accesses, the near memory access may temporarily consume more than its associated maximum bandwidth. Similarly, when there are no near memory accesses, the far memory accesses may temporarily consume more than its associated maximum bandwidth. In an embodiment, threshold values are used to identify underutilization of the near memory so that the far memory can temporarily consume more than its maximum bandwidth while the near memory accesses have priority over the far memory accesses.

While interleaving balances the memory bandwidth across all of the memories in the different memory pools (near and far), interleaving also increases overall access latency because the latency is greater for accessing the off-package memory compared with accessing the on-package memory. When interleaving is used, the off-package memory bandwidth is effectively partitioned between the near memory and the far memory pools so that the far memory traffic does not reduce the bandwidth available for the near memory requests. In an embodiment, the logic base layer 130 determines the interleaving ratio based on the memory bandwidths for the different memory types and arbitrates between near and far memory accesses, as needed to ensure that the amount of memory bandwidth is provided and QoS is maintained.

Applications that do not benefit from greater memory capacity will realize a memory bandwidth boost from the additive bandwidth of off-package memory in the interleaved mode. Workloads that are limited by memory capacity can access of the off-package memory at a higher bandwidth compared with conventional solutions that rely on slower (in terms of bandwidth and/or latency) interfaces to access the additional memory.

Figure 3B:
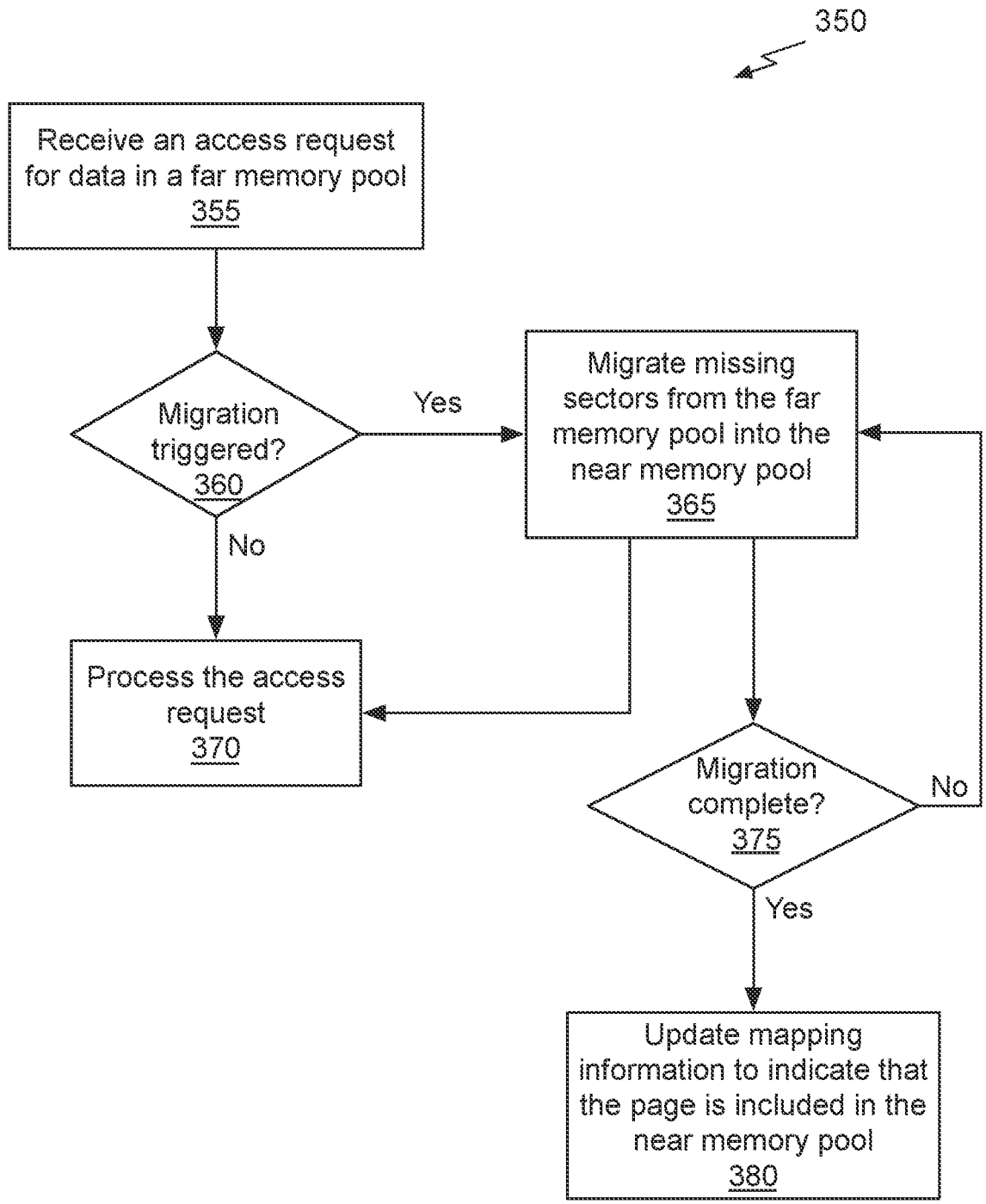
FIG. 3B illustrates a flowchart of a method for data migration suitable for use in implementing some embodiments of the present disclosure.

FIG. 3B illustrates a flowchart of a method 350 for data migration suitable for use in implementing some embodiments of the present disclosure. Each block of method 350, described herein, comprises a computing process that may be performed using any combination of hardware, firmware, and/or software. For instance, various functions may be carried out by a processor executing instructions stored in memory. The method may also be embodied as computer-usable instructions stored on computer storage media. The method may be provided by a standalone application, a service or hosted service (standalone or in combination with another hosted service), or a plug-in to another product, to name a few. In addition, method 350 is described, by way of example, with respect to the processor 110 coupled to the combined on-package and off-package memory system of FIG. 1A and/or the processor 250 coupled to the memory system 255 through the logic base layer 130 of FIG. 2B. However, this method may additionally or alternatively be executed by any one system, or any combination of systems, including, but not limited to, those described herein. Furthermore, persons of ordinary skill in the art will understand that any system that performs method 350 is within the scope and spirit of embodiments of the present disclosure.

At step 355, a memory access request is received for data stored in a far memory pool. In an embodiment, the memory access request is received from a processor that is directly coupled to a base layer within a single package with the processor and the base layer is coupled between the processor and a memory system. The memory system includes on-package memory that is enclosed in the single package and off-package memory that is external to the single package. In an embodiment, a near memory pool includes a combination of the on-package memory and the off-package memory and the far memory pool includes only the off-package memory.

At step 360, memory management logic that is fabricated within the base layer determines if a migration is triggered. In an embodiment, the migration is triggered when a threshold number of accesses associated with the access request is exceeded. For example, the access request specifies an address within a page of memory and the number of accesses for the page within a time period is tracked by the memory management logic for comparison with a threshold value. When the access request does not result in a cache hit, the data may be loaded into the cache from a location in the far memory pool and the number of accesses is initialized. If an empty cache line is not available, data stored in a cache line may be evicted. Any dirty sectors in the evicted cache line are written back to locations in the near or far memory, based on information in the page table. In an embodiment, the memory management logic determines that a threshold number of sectors have been loaded into a cache line for a page to trigger the migration process for the page.

If, at step 360, the migration is not triggered, then at step 370 the access request is processed. Otherwise, at step 365, the memory management logic migrates missing sectors in from the far memory pool into the near memory pool. In an embodiment, a cache line stores multiple sectors of a memory page and sectors that store data for the page are valid and sectors that have not been loaded with data for the page are not valid and considered missing. In an embodiment, the migration process starting at step 365 may be triggered or initiated by execution of an instruction.

The migration process may be performed without slowing processing of access requests. In an embodiment, processor initiated requests are unconditionally processed and the page migration is opportunistically performed in the background without interfering with processing of the processor initiated requests. Therefore, the migration process is initiated at step 365 and then the access request is processed at step 370 while the page migration continues at step 375. For example, the first 512 sectors in a page are accessed, triggering a migration of the page, and the first 100 sectors are migrated before the processor requests sectors 200-300. The requests for sectors 200-300 are serviced (and loaded into the cache) and then migration resumes to copy sectors 101-199, before skipping ahead to sector 301 to continue the migration. Because the processor-initiated accesses accomplished migrating some of the sectors before the migration engine, no redundant work was performed for the migration. The page migration is transparent both in terms of processing processor initiated accesses (no TLB shootdowns, etc.) and in terms of access performance.

At step 375, the memory management logic determines if migration of the entire page is complete, and if not, the memory management logic returns to step 365 to migrate the missing sectors. When the migration is complete, then at step 380 the memory management logic updates mapping information for the page to indicate that the page is included in the near memory pool.

In an embodiment, the near memory pool includes first locations in at least one memory stack and second locations in at least one memory device. The first and second locations may be interleaved within the near memory pool according to an address mapping performed by the memory management logic. In an embodiment, the memory management logic migrates first data stored in third locations in the at least one memory device that are not included in the near memory pool to the near memory pool in response to a trigger. The trigger may be exceeding a threshold number of memory access requests for the third locations within a time period. In a embodiment, portions of the first data are copied from the third locations to the first memory pool while at least one additional memory access request is processed. In an embodiment, the memory management logic updates an address mapping for the first data to indicate that the first data is stored in the first memory pool after the first data is migrated. In an embodiment, the memory management logic migrates data stored in the first memory pool to fourth locations in the at least one memory device that are not included in the first memory pool and updates an address mapping to indicate that the data is stored in the fourth locations.

Providing unified memory comprising both on and off package memory for a processor through a base layer may increase both the available memory capacity and memory bandwidth. The on-package memory type may be different compared with the off-package memory type with corresponding interfaces provided by the base layer. Bandwidth between the processor and base layer may be higher compared with the bandwidth to either the on-package memory or the off-package memory. In an embodiment, the memory capacity is partitioned into near and far memory pools and portions of the off-package memory assigned to the near memory pool are interleaved with portions of the on-package memory to provide a higher aggregate memory bandwidth compared with using only the on-package memory for the near memory pool.

Logic fabricated in the base layer offloads memory management tasks from the processor and enables a variety of different memory configurations having different interfaces, signaling technologies, capacities, device types, and the like. The logic may steer requests to the correct memory based on address and/or interface mapping information stored in the base layer. The logic may also migrate data between near and far memory pools, even while continuing to process access requests. The logic decouples the processor from the memory system, enabling the processor and memory system to evolve independently.

Increasing the available memory capacity using the on and off package memory system may improve datacenter performance for workloads such as recommender system training. When the processor 110 is a GPU, using the on and off package memory system may benefit GPU-accelerated databases and other workloads where the working set is too big to fit in the on-package memory for a single GPU. Another service that may benefit from the on and off package memory system is virtualization of a datacenter where disparate workloads with diverse memory bandwidth and capacity needs can be served by a single processor using the on and off package memory system.

Parallel Processing Architecture

Figure 4:
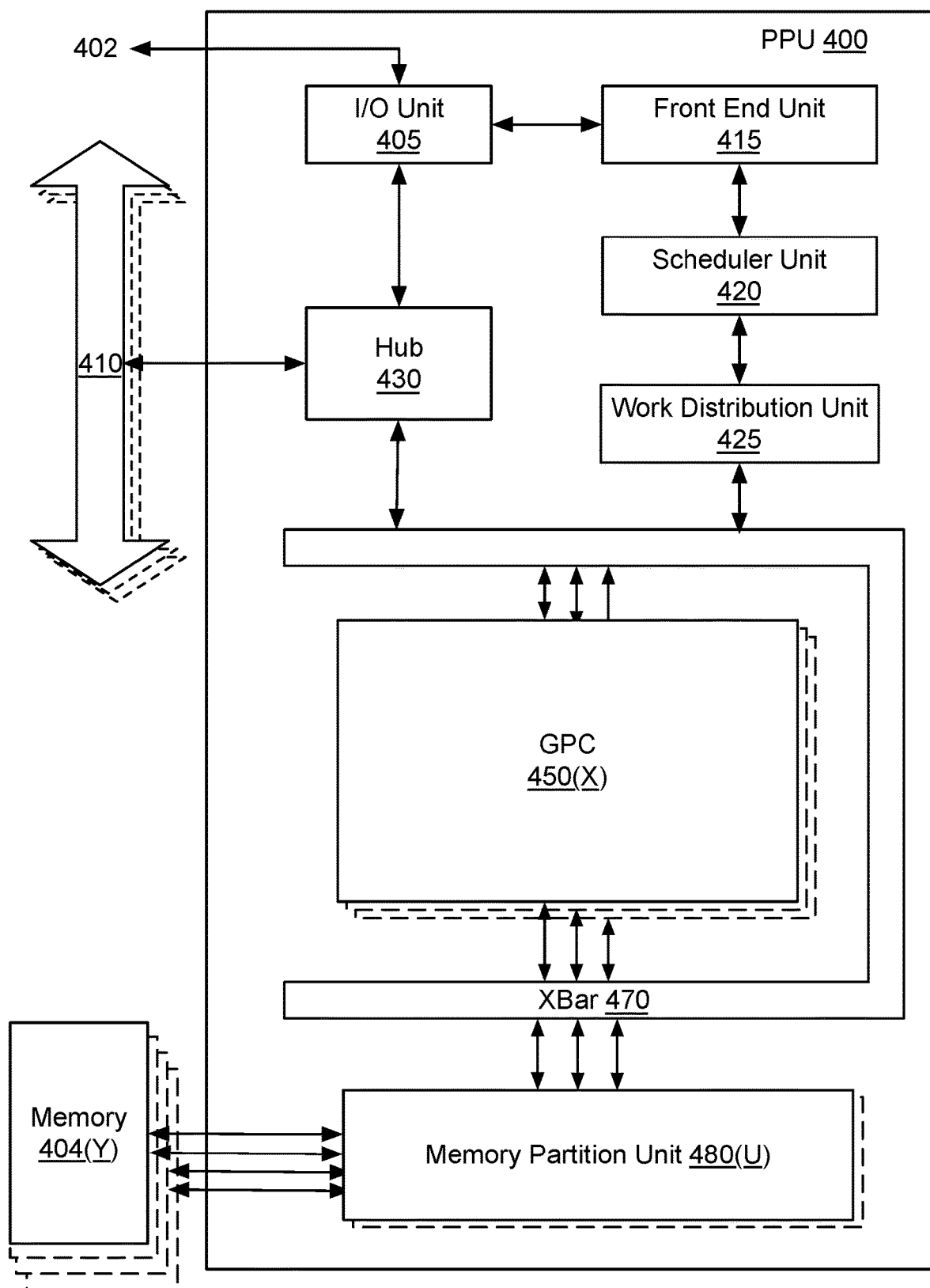
FIG. 4 illustrates an example parallel processing unit suitable for use in implementing some embodiments of the present disclosure.

FIG. 4 illustrates a parallel processing unit (PPU) 400, in accordance with an embodiment. The PPU 400 may be used to implement the processor 110 within the processing system 100 or the processor 250 within the computing system 200. In an embodiment, a processor such as the PPU 400 may be configured to implement a neural network model. The neural network model may be implemented as software instructions executed by the processor or, in other embodiments, the processor can include a matrix of hardware elements configured to process a set of inputs (e.g., electrical signals representing values) to generate a set of outputs, which can represent activations of the neural network model. In yet other embodiments, the neural network model can be implemented as a combination of software instructions and processing performed by a matrix of hardware elements. Implementing the neural network model can include determining a set of parameters for the neural network model through, e.g., supervised or unsupervised training of the neural network model as well as, or in the alternative, performing inference using the set of parameters to process novel sets of inputs.

In an embodiment, the PPU 400 is a multi-threaded processor that is implemented on one or more integrated circuit devices. The PPU 400 is a latency hiding architecture designed to process many threads in parallel. A thread (e.g., a thread of execution) is an instantiation of a set of instructions configured to be executed by the PPU 400. In an embodiment, the PPU 400 is a graphics processing unit (GPU) configured to implement a graphics rendering pipeline for processing three-dimensional (3D) graphics data in order to generate two-dimensional (2D) image data for display on a display device. In other embodiments, the PPU 400 may be utilized for performing general-purpose computations. While one exemplary parallel processor is provided herein for illustrative purposes, it should be strongly noted that such processor is set forth for illustrative purposes only, and that any processor may be employed to supplement and/or substitute for the same.

One or more PPUs 400 may be configured to accelerate thousands of High Performance Computing (HPC), data center, cloud computing, and machine learning applications.

The PPU 400 may be configured to accelerate numerous deep learning systems and applications for autonomous vehicles, simulation, computational graphics such as ray or path tracing, deep learning, high-accuracy speech, image, and text recognition systems, intelligent video analytics, molecular simulations, drug discovery, disease diagnosis, weather forecasting, big data analytics, astronomy, molecular dynamics simulation, financial modeling, robotics, factory automation, real-time language translation, online search optimizations, and personalized user recommendations, and the like.

As shown in FIG. 4, the PPU 400 includes an Input/Output (I/O) unit 405, a front end unit 415, a scheduler unit 420, a work distribution unit 425, a hub 430, a crossbar (Xbar) 470, one or more general processing clusters (GPCs) 450, and one or more memory partition units 480. The PPU 400 may be connected to a host processor or other PPUs 400 via one or more high-speed NVLink 410 interconnect. The PPU 400 may be connected to a host processor or other peripheral devices via an interconnect 402. The PPU 400 may also be connected to a local memory 404 comprising a number of memory devices. In an embodiment, the local memory may comprise a number of dynamic random access memory (DRAM) devices. The DRAM devices may be configured as a high-bandwidth memory (HBM) subsystem, with multiple DRAM dies stacked within each device. In an embodiment, the local memory 404 comprises the local base layer 130 and the memory system 255.

The NVLink 410 interconnect enables systems to scale and include one or more PPUs 400 combined with one or more CPUs, supports cache coherence between the PPUs 400 and CPUs, and CPU mastering. Data and/or commands may be transmitted by the NVLink 410 through the hub 430 to/from other units of the PPU 400 such as one or more copy engines, a video encoder, a video decoder, a power management unit, etc. (not explicitly shown). The NVLink 410 is described in more detail in conjunction with FIG. 5B.

The I/O unit 405 is configured to transmit and receive communications (e.g., commands, data, etc.) from a host processor (not shown) over the interconnect 402. The I/O unit 405 may communicate with the host processor directly via the interconnect 402 or through one or more intermediate devices such as a memory bridge. In an embodiment, the I/O unit 405 may communicate with one or more other processors, such as one or more the PPUs 400 via the interconnect 402. In an embodiment, the I/O unit 405 implements a Peripheral Component Interconnect Express (PCIe) interface for communications over a PCIe bus and the interconnect 402 is a PCIe bus. In alternative embodiments, the I/O unit 405 may implement other types of well-known interfaces for communicating with external devices.

The I/O unit 405 decodes packets received via the interconnect 402. In an embodiment, the packets represent commands configured to cause the PPU 400 to perform various operations. The I/O unit 405 transmits the decoded commands to various other units of the PPU 400 as the commands may specify. For example, some commands may be transmitted to the front end unit 415. Other commands may be transmitted to the hub 430 or other units of the PPU 400 such as one or more copy engines, a video encoder, a video decoder, a power management unit, etc. (not explicitly shown). In other words, the I/O unit 405 is configured to route communications between and among the various logical units of the PPU 400.

In an embodiment, a program executed by the host processor encodes a command stream in a buffer that provides workloads to the PPU 400 for processing. A workload may comprise several instructions and data to be processed by those instructions. The buffer is a region in a memory that is accessible (e.g., read/write) by both the host processor and the PPU 400. For example, the I/O unit 405 may be configured to access the buffer in a system memory connected to the interconnect 402 via memory requests transmitted over the interconnect 402. In an embodiment, the host processor writes the command stream to the buffer and then transmits a pointer to the start of the command stream to the PPU 400. The front end unit 415 receives pointers to one or more command streams. The front end unit 415 manages the one or more streams, reading commands from the streams and forwarding commands to the various units of the PPU 400.

The front end unit 415 is coupled to a scheduler unit 420 that configures the various GPCs 450 to process tasks defined by the one or more streams. The scheduler unit 420 is configured to track state information related to the various tasks managed by the scheduler unit 420. The state may indicate which GPC 450 a task is assigned to, whether the task is active or inactive, a priority level associated with the task, and so forth. The scheduler unit 420 manages the execution of a plurality of tasks on the one or more GPCs 450.

The scheduler unit 420 is coupled to a work distribution unit 425 that is configured to dispatch tasks for execution on the GPCs 450. The work distribution unit 425 may track a number of scheduled tasks received from the scheduler unit 420. In an embodiment, the work distribution unit 425 manages a pending task pool and an active task pool for each of the GPCs 450. As a GPC 450 finishes the execution of a task, that task is evicted from the active task pool for the GPC 450 and one of the other tasks from the pending task pool is selected and scheduled for execution on the GPC 450. If an active task has been idle on the GPC 450, such as while waiting for a data dependency to be resolved, then the active task may be evicted from the GPC 450 and returned to the pending task pool while another task in the pending task pool is selected and scheduled for execution on the GPC 450.

In an embodiment, a host processor executes a driver kernel that implements an application programming interface (API) that enables one or more applications executing on the host processor to schedule operations for execution on the PPU 400. In an embodiment, multiple compute applications are simultaneously executed by the PPU 400 and the PPU 400 provides isolation, quality of service (QoS), and independent address spaces for the multiple compute applications. An application may generate instructions (e.g., API calls) that cause the driver kernel to generate one or more tasks for execution by the PPU 400. The driver kernel outputs tasks to one or more streams being processed by the PPU 400. Each task may comprise one or more groups of related threads, referred to herein as a warp. In an embodiment, a warp comprises 32 related threads that may be executed in parallel. Cooperating threads may refer to a plurality of threads including instructions to perform the task and that may exchange data through shared memory. The tasks may be allocated to one or more processing units within a GPC 450 and instructions are scheduled for execution by at least one warp.

The work distribution unit 425 communicates with the one or more GPCs 450 via XBar 470. The XBar 470 is an interconnect network that couples many of the units of the PPU 400 to other units of the PPU 400. For example, the XBar 470 may be configured to couple the work distribution unit 425 to a particular GPC 450. Although not shown explicitly, one or more other units of the PPU 400 may also be connected to the XBar 470 via the hub 430.

The tasks are managed by the scheduler unit 420 and dispatched to a GPC 450 by the work distribution unit 425. The GPC 450 is configured to process the task and generate results. The results may be consumed by other tasks within the GPC 450, routed to a different GPC 450 via the XBar 470, or stored in the memory 404. The results can be written to the memory 404 via the memory partition units 480, which implement a memory interface for reading and writing data to/from the memory 404. The results can be transmitted to another PPU 400 or CPU via the NVLink 410. In an embodiment, the PPU 400 includes a number U of memory partition units 480 that is equal to the number of separate and distinct combined on and off package memory systems of the memory 404 coupled to the PPU 400. Each GPC 450 may include a memory management unit to provide translation of virtual addresses into physical addresses, memory protection, and arbitration of memory requests. In an embodiment, the memory management unit provides one or more translation lookaside buffers (TLBs) for performing translation of virtual addresses into physical addresses in the memory 404. In an embodiment, the memory management unit translates virtual addresses into partition interface addresses and further mapping is performed by a logic base layer 130 in the memory 404. In other words, the GPC 450 need not be aware of the location of data except to determine which one of the U memory partition units 480 that the data is associated with.

In an embodiment, the memory partition unit 480 includes a Raster Operations (ROP) unit, a level two (L2) cache, and a memory interface that is coupled to the memory 404. The memory interface may implement 32, 64, 128, 1024-bit data buses, or the like, for high-speed data transfer. The PPU 400 may be connected to up to Y memory devices, such as high bandwidth memory stacks or graphics double-data-rate, version 5, synchronous dynamic random access memory, or other types of persistent storage. In an embodiment, the memory interface implements an HBM2 memory interface and Y equals half U. In an embodiment, the HBM2 memory stacks are located on the same physical package as the PPU 400, providing substantial power and area savings compared with conventional GDDR5 SDRAM systems. In an embodiment, each HBM2 stack includes four memory dies and Y equals 4, with each HBM2 stack including two 128-bit channels per die for a total of 8 channels and a data bus width of 1024 bits.

In an embodiment, the memory 404 supports Single-Error Correcting Double-Error Detecting (SECDED) Error Correction Code (ECC) to protect data. ECC provides higher reliability for compute applications that are sensitive to data corruption. Reliability is especially important in large-scale cluster computing environments where PPUs 400 process very large datasets and/or run applications for extended periods.

In an embodiment, the PPU 400 implements a multi-level memory hierarchy. In an embodiment, the memory partition unit 480 supports a unified memory to provide a single unified virtual address space for CPU and PPU 400 memory, enabling data sharing between virtual memory systems. In an embodiment the frequency of accesses by a PPU 400 to memory located on other processors is traced to ensure that memory pages are moved to the physical memory of the PPU 400 that is accessing the pages more frequently. In an embodiment, the NVLink 410 supports address translation services allowing the PPU 400 to directly access a CPU's page tables and providing full access to CPU memory by the PPU 400.

In an embodiment, copy engines transfer data between multiple PPUs 400 or between PPUs 400 and CPUs. The copy engines can generate page faults for addresses that are not mapped into the page tables. The memory partition unit 480 can then service the page faults, mapping the addresses into the page table, after which the copy engine can perform the transfer. In a conventional system, memory is pinned (e.g., non-pageable) for multiple copy engine operations between multiple processors, substantially reducing the available memory. With hardware page faulting, addresses can be passed to the copy engines without worrying if the memory pages are resident, and the copy process is transparent.

Data from the memory 404 or other system memory may be fetched by the memory partition unit 480 and stored in the L2 cache 460, which is located on-chip and is shared between the various GPCs 450. As shown, each memory partition unit 480 includes a portion of the L2 cache associated with a corresponding memory 404. Lower level caches may then be implemented in various units within the GPCs 450. For example, each of the processing units within a GPC 450 may implement a level one (L1) cache. The L1 cache is private memory that is dedicated to a particular processing unit. The L2 cache 460 is coupled to the memory interface 470 and the XBar 470 and data from the L2 cache may be fetched and stored in each of the L1 caches for processing.

In an embodiment, the processing units within each GPC 450 implement a SIMD (Single-Instruction, Multiple-Data) architecture where each thread in a group of threads (e.g., a warp) is configured to process a different set of data based on the same set of instructions. All threads in the group of threads execute the same instructions. In another embodiment, the processing unit implements a SIMT (Single-Instruction, Multiple Thread) architecture where each thread in a group of threads is configured to process a different set of data based on the same set of instructions, but where individual threads in the group of threads are allowed to diverge during execution. In an embodiment, a program counter, call stack, and execution state is maintained for each warp, enabling concurrency between warps and serial execution within warps when threads within the warp diverge. In another embodiment, a program counter, call stack, and execution state is maintained for each individual thread, enabling equal concurrency between all threads, within and between warps. When execution state is maintained for each individual thread, threads executing the same instructions may be converged and executed in parallel for maximum efficiency.

Cooperative Groups is a programming model for organizing groups of communicating threads that allows developers to express the granularity at which threads are communicating, enabling the expression of richer, more efficient parallel decompositions. Cooperative launch APIs support synchronization amongst thread blocks for the execution of parallel algorithms. Conventional programming models provide a single, simple construct for synchronizing cooperating threads: a barrier across all threads of a thread block (e.g., the syncthreads( ) function). However, programmers would often like to define groups of threads at smaller than thread block granularities and synchronize within the defined groups to enable greater performance, design flexibility, and software reuse in the form of collective group-wide function interfaces.

Cooperative Groups enables programmers to define groups of threads explicitly at sub-block (e.g., as small as a single thread) and multi-block granularities, and to perform collective operations such as synchronization on the threads in a cooperative group. The programming model supports clean composition across software boundaries, so that libraries and utility functions can synchronize safely within their local context without having to make assumptions about convergence. Cooperative Groups primitives enable new patterns of cooperative parallelism, including producer-consumer parallelism, opportunistic parallelism, and global synchronization across an entire grid of thread blocks.

Each processing unit includes a large number (e.g., 128, etc.) of distinct processing cores (e.g., functional units) that may be fully-pipelined, single-precision, double-precision, and/or mixed precision and include a floating point arithmetic logic unit and an integer arithmetic logic unit. In an embodiment, the floating point arithmetic logic units implement the IEEE 754-2008 standard for floating point arithmetic. In an embodiment, the cores include 64 single-precision (32-bit) floating point cores, 64 integer cores, 32 double-precision (64-bit) floating point cores, and 8 tensor cores.

Tensor cores configured to perform matrix operations. In particular, the tensor cores are configured to perform deep learning matrix arithmetic, such as GEMM (matrix-matrix multiplication) for convolution operations during neural network training and inferencing. In an embodiment, each tensor core operates on a 4×4 matrix and performs a matrix multiply and accumulate operation D=A'B+C, where A, B, C, and D are 4×4 matrices.

In an embodiment, the matrix multiply inputs A and B may be integer, fixed-point, or floating point matrices, while the accumulation matrices C and D may be integer, fixed-point, or floating point matrices of equal or higher bitwidths. In an embodiment, tensor cores operate on one, four, or eight bit integer input data with 32-bit integer accumulation. The 8-bit integer matrix multiply requires 1024 operations and results in a full precision product that is then accumulated using 32-bit integer addition with the other intermediate products for a 8×8×16 matrix multiply. In an embodiment, tensor Cores operate on 16-bit floating point input data with 32-bit floating point accumulation. The 16-bit floating point multiply requires 64 operations and results in a full precision product that is then accumulated using 32-bit floating point addition with the other intermediate products for a 4×4×4 matrix multiply. In practice, Tensor Cores are used to perform much larger two-dimensional or higher dimensional matrix operations, built up from these smaller elements. An API, such as CUDA 9 C++ API, exposes specialized matrix load, matrix multiply and accumulate, and matrix store operations to efficiently use Tensor Cores from a CUDA-C++ program. At the CUDA level, the warp-level interface assumes 16×16 size matrices spanning all 32 threads of the warp.

Each processing unit may also comprise M special function units (SFUs) that perform special functions (e.g., attribute evaluation, reciprocal square root, and the like). In an embodiment, the SFUs may include a tree traversal unit configured to traverse a hierarchical tree data structure. In an embodiment, the SFUs may include texture unit configured to perform texture map filtering operations. In an embodiment, the texture units are configured to load texture maps (e.g., a 2D array of texels) from the memory 404 and sample the texture maps to produce sampled texture values for use in shader programs executed by the processing unit. In an embodiment, the texture maps are stored in shared memory that may comprise or include an L1 cache. The texture units implement texture operations such as filtering operations using mip-maps (e.g., texture maps of varying levels of detail). In an embodiment, each processing unit includes two texture units.

Each processing unit also comprises N load store units (LSUs) that implement load and store operations between the shared memory and the register file. Each processing unit includes an interconnect network that connects each of the cores to the register file and the LSU to the register file, shared memory. In an embodiment, the interconnect network is a crossbar that can be configured to connect any of the cores to any of the registers in the register file and connect the LSUs to the register file and memory locations in shared memory.

The shared memory is an array of on-chip memory that allows for data storage and communication between the processing units and between threads within a processing unit. In an embodiment, the shared memory comprises 128 KB of storage capacity and is in the path from each of the processing units to the memory partition unit 480. The shared memory can be used to cache reads and writes. One or more of the shared memory, L1 cache, L2 cache, and memory 404 are backing stores.

Combining data cache and shared memory functionality into a single memory block provides the best overall performance for both types of memory accesses. The capacity is usable as a cache by programs that do not use shared memory. For example, if shared memory is configured to use half of the capacity, texture and load/store operations can use the remaining capacity. Integration within the shared memory enables the shared memory to function as a high-throughput conduit for streaming data while simultaneously providing high-bandwidth and low-latency access to frequently reused data.

When configured for general purpose parallel computation, a simpler configuration can be used compared with graphics processing. Specifically, fixed function graphics processing units, are bypassed, creating a much simpler programming model. In the general purpose parallel computation configuration, the work distribution unit 425 assigns and distributes blocks of threads directly to the processing units within the GPCs 450. Threads execute the same program, using a unique thread ID in the calculation to ensure each thread generates unique results, using the processing unit(s) to execute the program and perform calculations, shared memory to communicate between threads, and the LSU to read and write global memory through the shared memory and the memory partition unit 480. When configured for general purpose parallel computation, the processing units can also write commands that the scheduler unit 420 can use to launch new work on the processing units.

The PPUs 400 may each include, and/or be configured to perform functions of, one or more processing cores and/or components thereof, such as Tensor Cores (TCs), Tensor Processing Units (TPUs), Pixel Visual Cores (PVCs), Ray Tracing (RT) Cores, Vision Processing Units (VPUs), Graphics Processing Clusters (GPCs), Texture Processing Clusters (TPCs), Streaming Multiprocessors (SMs), Tree Traversal Units (TTUs), Artificial Intelligence Accelerators (AIAs), Deep Learning Accelerators (DLAs), Arithmetic-Logic Units (ALUs), Application-Specific Integrated Circuits (ASICs), Floating Point Units (FPUs), input/output (I/O) elements, peripheral component interconnect (PCI) or peripheral component interconnect express (PCIe) elements, and/or the like.

The PPU 400 may be included in a desktop computer, a laptop computer, a tablet computer, servers, supercomputers, a smart-phone (e.g., a wireless, hand-held device), personal digital assistant (PDA), a digital camera, a vehicle, a head mounted display, a hand-held electronic device, and the like. In an embodiment, the PPU 400 is embodied on a single semiconductor substrate. In another embodiment, the PPU 400 is included in a system-on-a-chip (SoC) along with one or more other devices such as additional PPUs 400, the memory 404, a reduced instruction set computer (RISC) CPU, a memory management unit (MMU), a digital-to-analog converter (DAC), and the like.

In an embodiment, the PPU 400 may be included on a graphics card that includes one or more memory devices. The graphics card may be configured to interface with a PCIe slot on a motherboard of a desktop computer. In yet another embodiment, the PPU 400 may be an integrated graphics processing unit (iGPU) or parallel processor included in the chipset of the motherboard. In yet another embodiment, the PPU 400 may be realized in reconfigurable hardware. In yet another embodiment, parts of the PPU 400 may be realized in reconfigurable hardware.

Exemplary Computing System

Systems with multiple GPUs and CPUs are used in a variety of industries as developers expose and leverage more parallelism in applications such as artificial intelligence computing. High-performance GPU-accelerated systems with tens to many thousands of compute nodes are deployed in data centers, research facilities, and supercomputers to solve ever larger problems. As the number of processing devices within the high-performance systems increases, the communication and data transfer mechanisms need to scale to support the increased bandwidth.

Figure 5A:
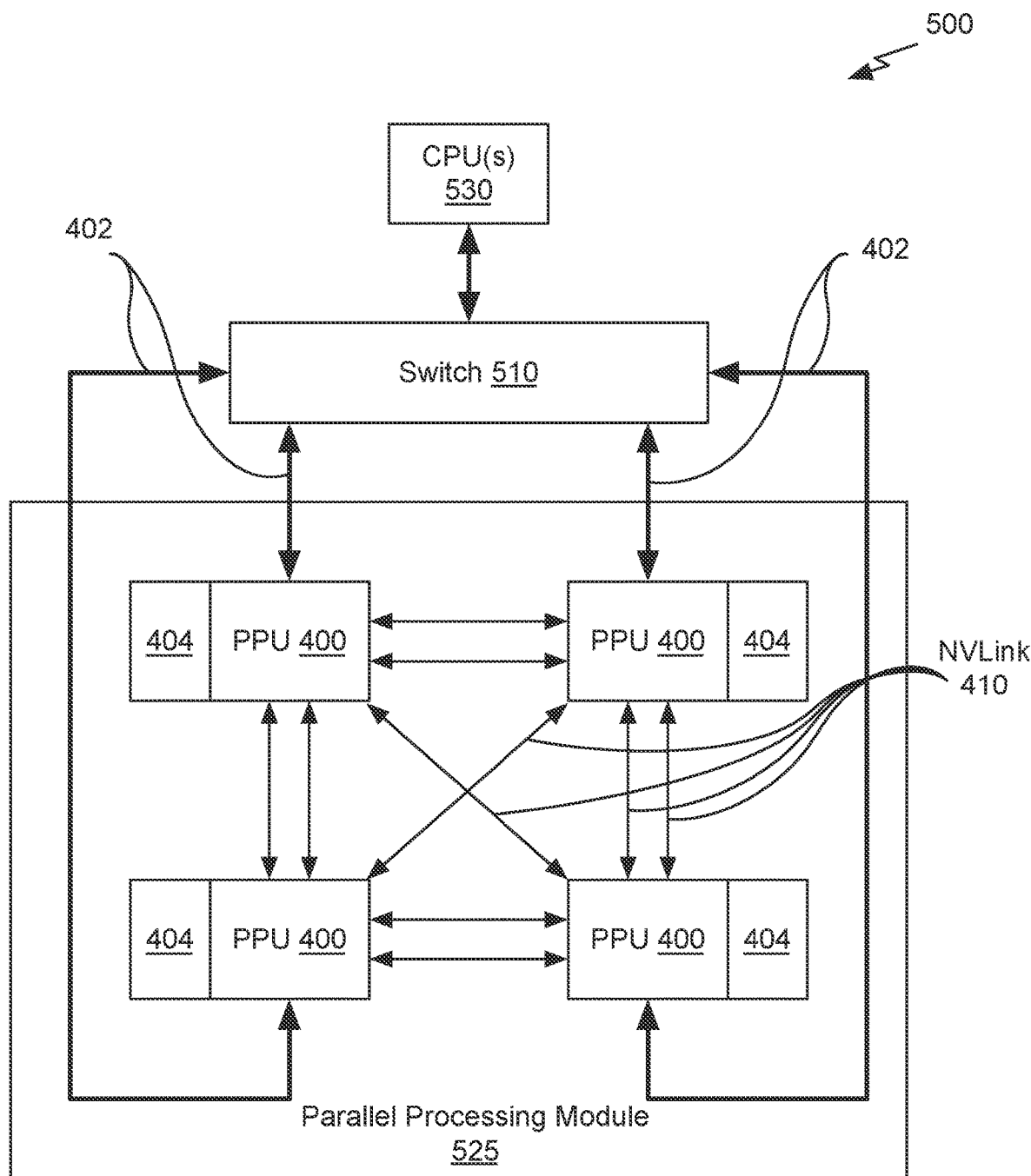
FIG. 5A is a conceptual diagram of a processing system implemented using the PPU of FIG. 4, suitable for use in implementing some embodiments of the present disclosure.

FIG. 5A is a conceptual diagram of a processing system 500 implemented using the PPU 400 of FIG. 4, in accordance with an embodiment. The exemplary system 500 may be configured to implement the method 150 shown in FIG. 1B and/or the method 350 shown in FIG. 3B. The processing system 500 includes a CPU 530, switch 510, and multiple PPUs 400, and respective memories 404.

Figure 5B:
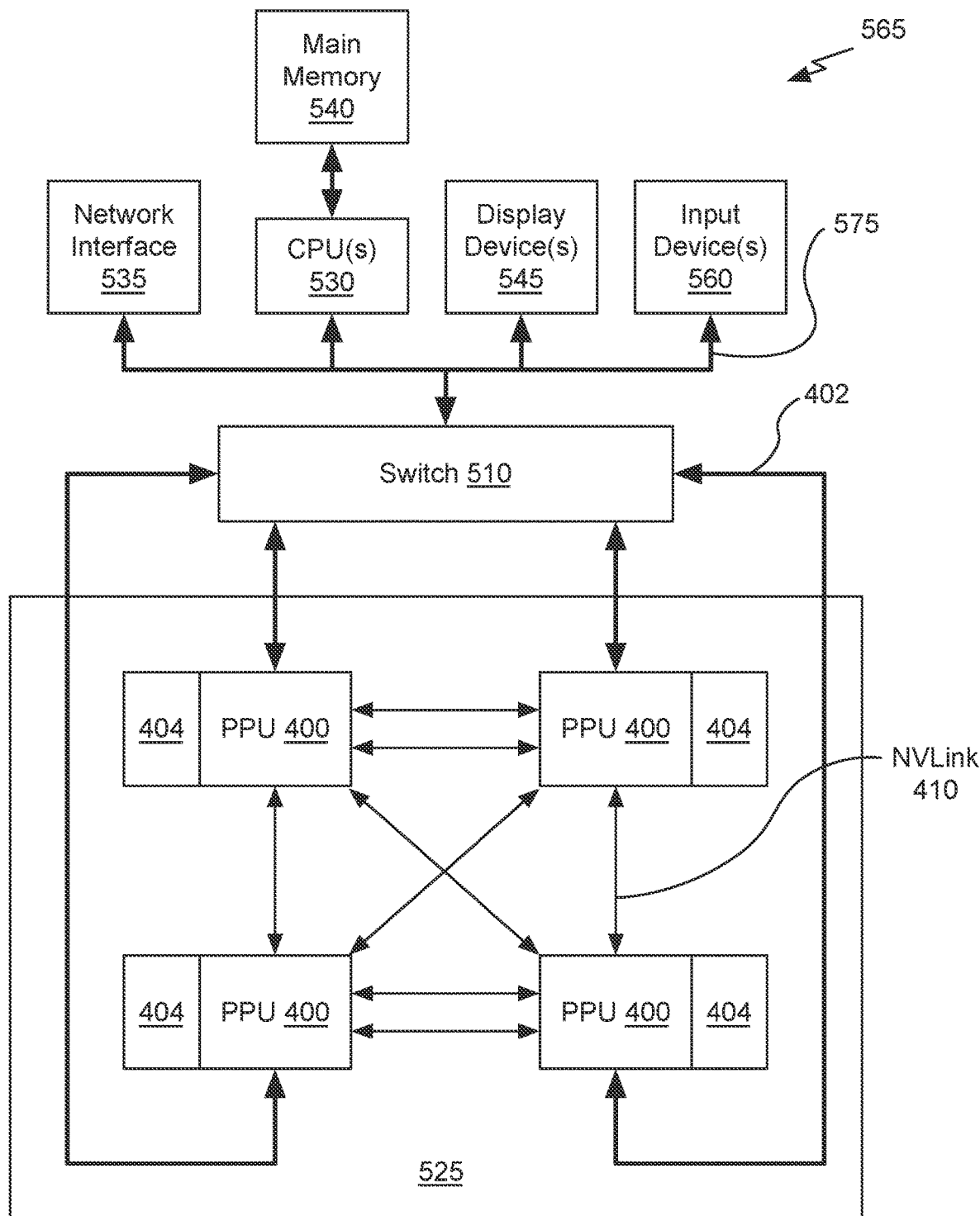
FIG. 5B illustrates an exemplary system in which the various architecture and/or functionality of the various previous embodiments may be implemented.

The NVLink 410 provides high-speed communication links between each of the PPUs 400. Although a particular number of NVLink 410 and interconnect 402 connections are illustrated in FIG. 5B, the number of connections to each PPU 400 and the CPU 530 may vary. The switch 510 interfaces between the interconnect 402 and the CPU 530. The PPUs 400, memories 404, and NVLinks 410 may be situated on a single semiconductor platform to form a parallel processing module 525. In an embodiment, the switch 510 supports two or more protocols to interface between various different connections and/or links.

In another embodiment (not shown), the NVLink 410 provides one or more high-speed communication links between each of the PPUs 400 and the CPU 530 and the switch 510 interfaces between the interconnect 402 and each of the PPUs 400. The PPUs 400, memories 404, and interconnect 402 may be situated on a single semiconductor platform to form a parallel processing module 525. In yet another embodiment (not shown), the interconnect 402 provides one or more communication links between each of the PPUs 400 and the CPU 530 and the switch 510 interfaces between each of the PPUs 400 using the NVLink 410 to provide one or more high-speed communication links between the PPUs 400. In another embodiment (not shown), the NVLink 410 provides one or more high-speed communication links between the PPUs 400 and the CPU 530 through the switch 510. In yet another embodiment (not shown), the interconnect 402 provides one or more communication links between each of the PPUs 400 directly. One or more of the NVLink 410 high-speed communication links may be implemented as a physical NVLink interconnect or either an on-chip or on-die interconnect using the same protocol as the NVLink 410.

In the context of the present description, a single semiconductor platform may refer to a sole unitary semiconductor-based integrated circuit fabricated on a die or chip. It should be noted that the term single semiconductor platform may also refer to multi-chip modules with increased connectivity which simulate on-chip operation and make substantial improvements over utilizing a conventional bus implementation. Of course, the various circuits or devices may also be situated separately or in various combinations of semiconductor platforms per the desires of the user. Alternately, the parallel processing module 525 may be implemented as a circuit board substrate and each of the PPUs 400 and/or memories 404 may be packaged devices. In an embodiment, the CPU 530, switch 510, and the parallel processing module 525 are situated on a single semiconductor platform.

In an embodiment, the signaling rate of each NVLink 410 is 20 to 25 Gigabits/second and each PPU 400 includes six NVLink 410 interfaces (as shown in FIG. 5A, five NVLink 410 interfaces are included for each PPU 400). Each NVLink 410 provides a data transfer rate of 25 Gigabytes/second in each direction, with six links providing 400 Gigabytes/second. The NVLinks 410 can be used exclusively for PPU-to-PPU communication as shown in FIG. 5A, or some combination of PPU-to-PPU and PPU-to-CPU, when the CPU 530 also includes one or more NVLink 410 interfaces.

In an embodiment, the NVLink 410 allows direct load/store/atomic access from the CPU 530 to each PPU's 400 memory 404. In an embodiment, the NVLink 410 supports coherency operations, allowing data read from the memories 404 to be stored in the cache hierarchy of the CPU 530, reducing cache access latency for the CPU 530. In an embodiment, the NVLink 410 includes support for Address Translation Services (ATS), allowing the PPU 400 to directly access page tables within the CPU 530. One or more of the NVLinks 410 may also be configured to operate in a low-power mode.

FIG. 5B illustrates an exemplary system 565 in which the various architecture and/or functionality of the various previous embodiments may be implemented. The exemplary system 565 may be configured to implement the method 150 shown in FIG. 1B and/or the method 350 shown in FIG. 3B.

As shown, a system 565 is provided including at least one central processing unit 530 that is connected to a communication bus 575. The communication bus 575 may directly or indirectly couple one or more of the following devices: main memory 540, network interface 535, CPU(s) 530, display device(s) 545, input device(s) 560, switch 510, and parallel processing system 525. The communication bus 575 may be implemented using any suitable protocol and may represent one or more links or busses, such as an address bus, a data bus, a control bus, or a combination thereof. The communication bus 575 may include one or more bus or link types, such as an industry standard architecture (ISA) bus, an extended industry standard architecture (EISA) bus, a video electronics standards association (VESA) bus, a peripheral component interconnect (PCI) bus, a peripheral component interconnect express (PCIe) bus, HyperTransport, and/or another type of bus or link. In some embodiments, there are direct connections between components. As an example, the CPU(s) 530 may be directly connected to the main memory 540. Further, the CPU(s) 530 may be directly connected to the parallel processing system 525. Where there is direct, or point-to-point connection between components, the communication bus 575 may include a PCIe link to carry out the connection. In these examples, a PCI bus need not be included in the system 565.

Although the various blocks of FIG. 5B are shown as connected via the communication bus 575 with lines, this is not intended to be limiting and is for clarity only. For example, in some embodiments, a presentation component, such as display device(s) 545, may be considered an I/O component, such as input device(s) 560 (e.g., if the display is a touch screen). As another example, the CPU(s) 530 and/or parallel processing system 525 may include memory (e.g., the main memory 540 may be representative of a storage device in addition to the parallel processing system 525, the CPUs 530, and/or other components). In other words, the computing device of FIG. 5B is merely illustrative. Distinction is not made between such categories as "workstation," "server," "laptop," "desktop," "tablet," "client device," "mobile device," "hand-held device," "game console," "electronic control unit (ECU)," "virtual reality system," and/or other device or system types, as all are contemplated within the scope of the computing device of FIG. 5B.

The system 565 also includes a main memory 540. Control logic (software) and data are stored in the main memory 540 which may take the form of a variety of computer-readable media. The computer-readable media may be any available media that may be accessed by the system 565. The computer-readable media may include both volatile and nonvolatile media, and removable and non-removable media. By way of example, and not limitation, the computer-readable media may comprise computer-storage media and communication media.

The computer-storage media may include both volatile and nonvolatile media and/or removable and non-removable media implemented in any method or technology for storage of information such as computer-readable instructions, data structures, program modules, and/or other data types. For example, the main memory 540 may store computer-readable instructions (e.g., that represent a program(s) and/or a program element(s), such as an operating system. Computer-storage media may include, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which may be used to store the desired information and which may be accessed by system 565. As used herein, computer storage media does not comprise signals per se.

The computer storage media may embody computer-readable instructions, data structures, program modules, and/or other data types in a modulated data signal such as a carrier wave or other transport mechanism and includes any information delivery media. The term "modulated data signal" may refer to a signal that has one or more of its characteristics set or changed in such a manner as to encode information in the signal. By way of example, and not limitation, the computer storage media may include wired media such as a wired network or direct-wired connection, and wireless media such as acoustic, RF, infrared and other wireless media. Combinations of any of the above should also be included within the scope of computer-readable media.

Computer programs, when executed, enable the system 565 to perform various functions. The CPU(s) 530 may be configured to execute at least some of the computer-readable instructions to control one or more components of the system 565 to perform one or more of the methods and/or processes described herein. The CPU(s) 530 may each include one or more cores (e.g., one, two, four, eight, twenty-eight, seventy-two, etc.) that are capable of handling a multitude of software threads simultaneously. The CPU(s) 530 may include any type of processor, and may include different types of processors depending on the type of system 565 implemented (e.g., processors with fewer cores for mobile devices and processors with more cores for servers). For example, depending on the type of system 565, the processor may be an Advanced RISC Machines (ARM) processor implemented using Reduced Instruction Set Computing (RISC) or an x86 processor implemented using Complex Instruction Set Computing (CISC). The system 565 may include one or more CPUs 530 in addition to one or more microprocessors or supplementary co-processors, such as math co-processors.

In addition to or alternatively from the CPU(s) 530, the parallel processing module 525 may be configured to execute at least some of the computer-readable instructions to control one or more components of the system 565 to perform one or more of the methods and/or processes described herein. The parallel processing module 525 may be used by the system 565 to render graphics (e.g., 3D graphics) or perform general purpose computations. For example, the parallel processing module 525 may be used for General-Purpose computing on GPUs (GPGPU). In embodiments, the CPU(s) 530 and/or the parallel processing module 525 may discretely or jointly perform any combination of the methods, processes and/or portions thereof.

The system 565 also includes input device(s) 560, the parallel processing system 525, and display device(s) 545. The display device(s) 545 may include a display (e.g., a monitor, a touch screen, a television screen, a heads-up-display (HUD), other display types, or a combination thereof), speakers, and/or other presentation components. The display device(s) 545 may receive data from other components (e.g., the parallel processing system 525, the CPU(s) 530, etc.), and output the data (e.g., as an image, video, sound, etc.).

The network interface 535 may enable the system 565 to be logically coupled to other devices including the input devices 560, the display device(s) 545, and/or other components, some of which may be built in to (e.g., integrated in) the system 565. Illustrative input devices 560 include a microphone, mouse, keyboard, joystick, game pad, game controller, satellite dish, scanner, printer, wireless device, etc. The input devices 560 may provide a natural user interface (NUI) that processes air gestures, voice, or other physiological inputs generated by a user. In some instances, inputs may be transmitted to an appropriate network element for further processing. An NUI may implement any combination of speech recognition, stylus recognition, facial recognition, biometric recognition, gesture recognition both on screen and adjacent to the screen, air gestures, head and eye tracking, and touch recognition (as described in more detail below) associated with a display of the system 565. The system 565 may be include depth cameras, such as stereoscopic camera systems, infrared camera systems, RGB camera systems, touchscreen technology, and combinations of these, for gesture detection and recognition. Additionally, the system 565 may include accelerometers or gyroscopes (e.g., as part of an inertia measurement unit (IMU)) that enable detection of motion. In some examples, the output of the accelerometers or gyroscopes may be used by the system 565 to render immersive augmented reality or virtual reality.

Further, the system 565 may be coupled to a network (e.g., a telecommunications network, local area network (LAN), wireless network, wide area network (WAN) such as the Internet, peer-to-peer network, cable network, or the like) through a network interface 535 for communication purposes. The system 565 may be included within a distributed network and/or cloud computing environment.

The network interface 535 may include one or more receivers, transmitters, and/or transceivers that enable the system 565 to communicate with other computing devices via an electronic communication network, included wired and/or wireless communications. The network interface 535 may include components and functionality to enable communication over any of a number of different networks, such as wireless networks (e.g., Wi-Fi, Z-Wave, Bluetooth, Bluetooth LE, ZigBee, etc.), wired networks (e.g., communicating over Ethernet or InfiniBand), low-power wide-area networks (e.g., LoRaWAN, SigFox, etc.), and/or the Internet.

The system 565 may also include a secondary storage (not shown). The secondary storage includes, for example, a hard disk drive and/or a removable storage drive, representing a floppy disk drive, a magnetic tape drive, a compact disk drive, digital versatile disk (DVD) drive, recording device, universal serial bus (USB) flash memory. The removable storage drive reads from and/or writes to a removable storage unit in a well-known manner. The system 565 may also include a hard-wired power supply, a battery power supply, or a combination thereof (not shown). The power supply may provide power to the system 565 to enable the components of the system 565 to operate.

Each of the foregoing modules and/or devices may even be situated on a single semiconductor platform to form the system 565. Alternately, the various modules may also be situated separately or in various combinations of semiconductor platforms per the desires of the user. While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

Example Network Environments

Network environments suitable for use in implementing embodiments of the disclosure may include one or more client devices, servers, network attached storage (NAS), other backend devices, and/or other device types. The client devices, servers, and/or other device types (e.g., each device) may be implemented on one or more instances of the processing system 500 of FIG. 5A and/or exemplary system 565 of FIG. 5B—e.g., each device may include similar components, features, and/or functionality of the processing system 500 and/or exemplary system 565.

Components of a network environment may communicate with each other via a network(s), which may be wired, wireless, or both. The network may include multiple networks, or a network of networks. By way of example, the network may include one or more Wide Area Networks (WANs), one or more Local Area Networks (LANs), one or more public networks such as the Internet and/or a public switched telephone network (PSTN), and/or one or more private networks. Where the network includes a wireless telecommunications network, components such as a base station, a communications tower, or even access points (as well as other components) may provide wireless connectivity.

Compatible network environments may include one or more peer-to-peer network environments—in which case a server may not be included in a network environment—and one or more client-server network environments—in which case one or more servers may be included in a network environment. In peer-to-peer network environments, functionality described herein with respect to a server(s) may be implemented on any number of client devices.

In at least one embodiment, a network environment may include one or more cloud-based network environments, a distributed computing environment, a combination thereof, etc. A cloud-based network environment may include a framework layer, a job scheduler, a resource manager, and a distributed file system implemented on one or more of servers, which may include one or more core network servers and/or edge servers. A framework layer may include a framework to support software of a software layer and/or one or more application(s) of an application layer. The software or application(s) may respectively include web-based service software or applications. In embodiments, one or more of the client devices may use the web-based service software or applications (e.g., by accessing the service software and/or applications via one or more application programming interfaces (APIs)). The framework layer may be, but is not limited to, a type of free and open-source software web application framework such as that may use a distributed file system for large-scale data processing (e.g., "big data").

A cloud-based network environment may provide cloud computing and/or cloud storage that carries out any combination of computing and/or data storage functions described herein (or one or more portions thereof). Any of these various functions may be distributed over multiple locations from central or core servers (e.g., of one or more data centers that may be distributed across a state, a region, a country, the globe, etc.). If a connection to a user (e.g., a client device) is relatively close to an edge server(s), a core server(s) may designate at least a portion of the functionality to the edge server(s). A cloud-based network environment may be private (e.g., limited to a single organization), may be public (e.g., available to many organizations), and/or a combination thereof (e.g., a hybrid cloud environment).

The client device(s) may include at least some of the components, features, and functionality of the example processing system 500 of FIG. 5A and/or exemplary system 565 of FIG. 5B. By way of example and not limitation, a client device may be embodied as a Personal Computer (PC), a laptop computer, a mobile device, a smartphone, a tablet computer, a smart watch, a wearable computer, a Personal Digital Assistant (PDA), an MP3 player, a virtual reality headset, a Global Positioning System (GPS) or device, a video player, a video camera, a surveillance device or system, a vehicle, a boat, a flying vessel, a virtual machine, a drone, a robot, a handheld communications device, a hospital device, a gaming device or system, an entertainment system, a vehicle computer system, an embedded system controller, a remote control, an appliance, a consumer electronic device, a workstation, an edge device, any combination of these delineated devices, or any other suitable device.

Machine Learning

Deep neural networks (DNNs) developed on processors, such as the PPU 400 have been used for diverse use cases, from self-driving cars to faster drug development, from automatic image captioning in online image databases to smart real-time language translation in video chat applications. Deep learning is a technique that models the neural learning process of the human brain, continually learning, continually getting smarter, and delivering more accurate results more quickly over time. A child is initially taught by an adult to correctly identify and classify various shapes, eventually being able to identify shapes without any coaching. Similarly, a deep learning or neural learning system needs to be trained in object recognition and classification for it get smarter and more efficient at identifying basic objects, occluded objects, etc., while also assigning context to objects.

At the simplest level, neurons in the human brain look at various inputs that are received, importance levels are assigned to each of these inputs, and output is passed on to other neurons to act upon. An artificial neuron or perceptron is the most basic model of a neural network. In one example, a perceptron may receive one or more inputs that represent various features of an object that the perceptron is being trained to recognize and classify, and each of these features is assigned a certain weight based on the importance of that feature in defining the shape of an object.

A deep neural network (DNN) model includes multiple layers of many connected nodes (e.g., perceptrons, Boltzmann machines, radial basis functions, convolutional layers, etc.) that can be trained with enormous amounts of input data to quickly solve complex problems with high accuracy. In one example, a first layer of the DNN model breaks down an input image of an automobile into various sections and looks for basic patterns such as lines and angles. The second layer assembles the lines to look for higher level patterns such as wheels, windshields, and mirrors. The next layer identifies the type of vehicle, and the final few layers generate a label for the input image, identifying the model of a specific automobile brand.

Once the DNN is trained, the DNN can be deployed and used to identify and classify objects or patterns in a process known as inference. Examples of inference (the process through which a DNN extracts useful information from a given input) include identifying handwritten numbers on checks deposited into ATM machines, identifying images of friends in photos, delivering movie recommendations to over fifty million users, identifying and classifying different types of automobiles, pedestrians, and road hazards in driverless cars, or translating human speech in real-time.

During training, data flows through the DNN in a forward propagation phase until a prediction is produced that indicates a label corresponding to the input. If the neural network does not correctly label the input, then errors between the correct label and the predicted label are analyzed, and the weights are adjusted for each feature during a backward propagation phase until the DNN correctly labels the input and other inputs in a training dataset. Training complex neural networks requires massive amounts of parallel computing performance, including floating-point multiplications and additions that are supported by the PPU 400. Inferencing is less compute-intensive than training, being a latency-sensitive process where a trained neural network is applied to new inputs it has not seen before to classify images, detect emotions, identify recommendations, recognize and translate speech, and generally infer new information.

Neural networks rely heavily on matrix math operations, and complex multi-layered networks require tremendous amounts of floating-point performance and bandwidth for both efficiency and speed. With thousands of processing cores, optimized for matrix math operations, and delivering tens to hundreds of TFLOPS of performance, the PPU 400 is a computing platform capable of delivering performance required for deep neural network-based artificial intelligence and machine learning applications.

Furthermore, images generated applying one or more of the techniques disclosed herein may be used to train, test, or certify DNNs used to recognize objects and environments in the real world. Such images may include scenes of roadways, factories, buildings, urban settings, rural settings, humans, animals, and any other physical object or real-world setting. Such images may be used to train, test, or certify DNNs that are employed in machines or robots to manipulate, handle, or modify physical objects in the real world. Furthermore, such images may be used to train, test, or certify DNNs that are employed in autonomous vehicles to navigate and move the vehicles through the real world. Additionally, images generated applying one or more of the techniques disclosed herein may be used to convey information to users of such machines, robots, and vehicles.

Figure 5C:
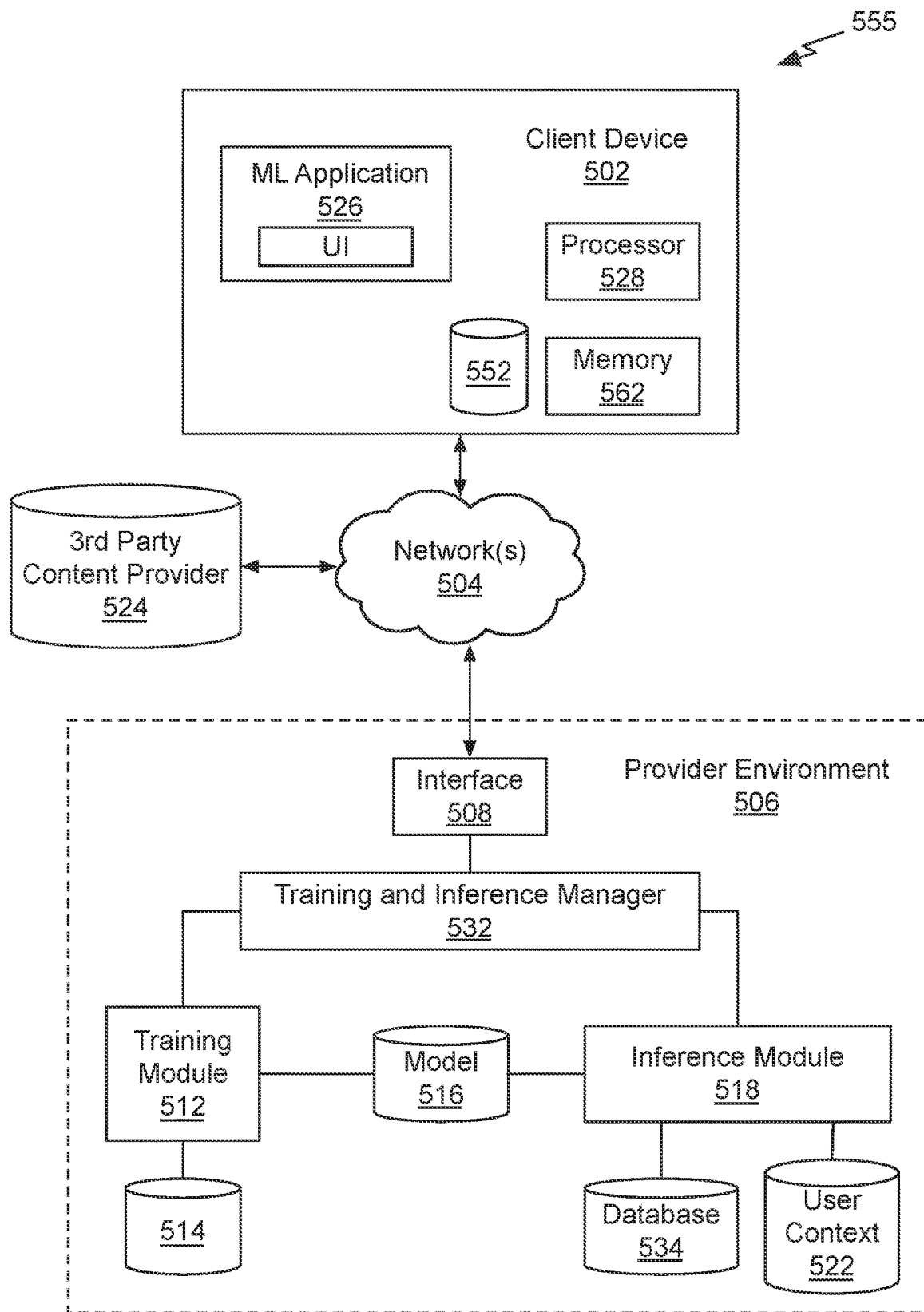
FIG. 5C illustrates components of an exemplary system that can be used to train and utilize machine learning, in at least one embodiment.

FIG. 5C illustrates components of an exemplary system 555 that can be used to train and utilize machine learning, in accordance with at least one embodiment. As will be discussed, various components can be provided by various combinations of computing devices and resources, or a single computing system, which may be under control of a single entity or multiple entities. Further, aspects may be triggered, initiated, or requested by different entities. In at least one embodiment training of a neural network might be instructed by a provider associated with provider environment 506, while in at least one embodiment training might be requested by a customer or other user having access to a provider environment through a client device 502 or other such resource. In at least one embodiment, training data (or data to be analyzed by a trained neural network) can be provided by a provider, a user, or a third party content provider 524. In at least one embodiment, client device 502 may be a vehicle or object that is to be navigated on behalf of a user, for example, which can submit requests and/or receive instructions that assist in navigation of a device.

In at least one embodiment, requests are able to be submitted across at least one network 504 to be received by a provider environment 506. In at least one embodiment, a client device may be any appropriate electronic and/or computing devices enabling a user to generate and send such requests, such as, but not limited to, desktop computers, notebook computers, computer servers, smartphones, tablet computers, gaming consoles (portable or otherwise), computer processors, computing logic, and set-top boxes. Network(s) 504 can include any appropriate network for transmitting a request or other such data, as may include Internet, an intranet, an Ethernet, a cellular network, a local area network (LAN), a wide area network (WAN), a personal area network (PAN), an ad hoc network of direct wireless connections among peers, and so on.

In at least one embodiment, requests can be received at an interface layer 508, which can forward data to a training and inference manager 532, in this example. The training and inference manager 532 can be a system or service including hardware and software for managing requests and service corresponding data or content, in at least one embodiment, the training and inference manager 532 can receive a request to train a neural network, and can provide data for a request to a training module 512. In at least one embodiment, training module 512 can select an appropriate model or neural network to be used, if not specified by the request, and can train a model using relevant training data. In at least one embodiment, training data can be a batch of data stored in a training data repository 514, received from client device 502, or obtained from a third party provider 524. In at least one embodiment, training module 512 can be responsible for training data. A neural network can be any appropriate network, such as a recurrent neural network (RNN) or convolutional neural network (CNN). Once a neural network is trained and successfully evaluated, a trained neural network can be stored in a model repository 516, for example, that may store different models or networks for users, applications, or services, etc. In at least one embodiment, there may be multiple models for a single application or entity, as may be utilized based on a number of different factors.

In at least one embodiment, at a subsequent point in time, a request may be received from client device 502 (or another such device) for content (e.g., path determinations) or data that is at least partially determined or impacted by a trained neural network. This request can include, for example, input data to be processed using a neural network to obtain one or more inferences or other output values, classifications, or predictions, or for at least one embodiment, input data can be received by interface layer 508 and directed to inference module 518, although a different system or service can be used as well. In at least one embodiment, inference module 518 can obtain an appropriate trained network, such as a trained deep neural network (DNN) as discussed herein, from model repository 516 if not already stored locally to inference module 518. Inference module 518 can provide data as input to a trained network, which can then generate one or more inferences as output. This may include, for example, a classification of an instance of input data. In at least one embodiment, inferences can then be transmitted to client device 502 for display or other communication to a user. In at least one embodiment, context data for a user may also be stored to a user context data repository 522, which may include data about a user which may be useful as input to a network in generating inferences, or determining data to return to a user after obtaining instances. In at least one embodiment, relevant data, which may include at least some of input or inference data, may also be stored to a local database 534 for processing future requests. In at least one embodiment, a user can use account information or other information to access resources or functionality of a provider environment. In at least one embodiment, if permitted and available, user data may also be collected and used to further train models, in order to provide more accurate inferences for future requests. In at least one embodiment, requests may be received through a user interface to a machine learning application 526 executing on client device 502, and results displayed through a same interface. A client device can include resources such as a processor 528 and memory 562 for generating a request and processing results or a response, as well as at least one data storage element 552 for storing data for machine learning application 526. In an embodiment, the memory 562 comprises the logic base layer 130 and the memory system 225.

In at least one embodiment a processor 528 (or a processor of training module 512 or inference module 518) will be a central processing unit (CPU). As mentioned, however, resources in such environments can utilize GPUs to process data for at least certain types of requests. With thousands of cores, GPUs, such as PPU 300 are designed to handle substantial parallel workloads and, therefore, have become popular in deep learning for training neural networks and generating predictions. While use of GPUs for offline builds has enabled faster training of larger and more complex models, generating predictions offline implies that either request-time input features cannot be used or predictions must be generated for all permutations of features and stored in a lookup table to serve real-time requests. If a deep learning framework supports a CPU-mode and a model is small and simple enough to perform a feed-forward on a CPU with a reasonable latency, then a service on a CPU instance could host a model. In this case, training can be done offline on a GPU and inference done in real-time on a CPU. If a CPU approach is not viable, then a service can run on a GPU instance. Because GPUs have different performance and cost characteristics than CPUs, however, running a service that offloads a runtime algorithm to a GPU can require it to be designed differently from a CPU based service.

In at least one embodiment, video data can be provided from client device 502 for enhancement in provider environment 506. In at least one embodiment, video data can be processed for enhancement on client device 502. In at least one embodiment, video data may be streamed from a third party content provider 524 and enhanced by third party content provider 524, provider environment 506, or client device 502. In at least one embodiment, video data can be provided from client device 502 for use as training data in provider environment 506.

In at least one embodiment, supervised and/or unsupervised training can be performed by the client device 502 and/or the provider environment 506. In at least one embodiment, a set of training data 514 (e.g., classified or labeled data) is provided as input to function as training data.

In at least one embodiment, training data can include instances of at least one type of object for which a neural network is to be trained, as well as information that identifies that type of object. In at least one embodiment, training data might include a set of images that each includes a representation of a type of object, where each image also includes, or is associated with, a label, metadata, classification, or other piece of information identifying a type of object represented in a respective image. Various other types of data may be used as training data as well, as may include text data, audio data, video data, and so on. In at least one embodiment, training data 514 is provided as training input to a training module 512. In at least one embodiment, training module 512 can be a system or service that includes hardware and software, such as one or more computing devices executing a training application, for training a neural network (or other model or algorithm, etc.). In at least one embodiment, training module 512 receives an instruction or request indicating a type of model to be used for training, in at least one embodiment, a model can be any appropriate statistical model, network, or algorithm useful for such purposes, as may include an artificial neural network, deep learning algorithm, learning classifier, Bayesian network, and so on. In at least one embodiment, training module 512 can select an initial model, or other untrained model, from an appropriate repository 516 and utilize training data 514 to train a model, thereby generating a trained model (e.g., trained deep neural network) that can be used to classify similar types of data, or generate other such inferences. In at least one embodiment where training data is not used, an appropriate initial model can still be selected for training on input data per training module 512.

In at least one embodiment, a model can be trained in a number of different ways, as may depend in part upon a type of model selected. In at least one embodiment, a machine learning algorithm can be provided with a set of training data, where a model is a model artifact created by a training process. In at least one embodiment, each instance of training data contains a correct answer (e.g., classification), which can be referred to as a target or target attribute. In at least one embodiment, a learning algorithm finds patterns in training data that map input data attributes to a target, an answer to be predicted, and a machine learning model is output that captures these patterns. In at least one embodiment, a machine learning model can then be used to obtain predictions on new data for which a target is not specified.

In at least one embodiment, training and inference manager 532 can select from a set of machine learning models including binary classification, multiclass classification, generative, and regression models. In at least one embodiment, a type of model to be used can depend at least in part upon a type of target to be predicted.

Graphics Processing Pipeline

In an embodiment, the PPU 400 comprises a graphics processing unit (GPU). The PPU 400 is configured to receive commands that specify shader programs for processing graphics data. Graphics data may be defined as a set of primitives such as points, lines, triangles, quads, triangle strips, and the like. Typically, a primitive includes data that specifies a number of vertices for the primitive (e.g., in a model-space coordinate system) as well as attributes associated with each vertex of the primitive. The PPU 400 can be configured to process the graphics primitives to generate a frame buffer (e.g., pixel data for each of the pixels of the display).

An application writes model data for a scene (e.g., a collection of vertices and attributes) to a memory such as a system memory or memory 404. The model data defines each of the objects that may be visible on a display. The application then makes an API call to the driver kernel that requests the model data to be rendered and displayed. The driver kernel reads the model data and writes commands to the one or more streams to perform operations to process the model data. The commands may reference different shader programs to be implemented on the processing units within the PPU 400 including one or more of a vertex shader, hull shader, domain shader, geometry shader, and a pixel shader. For example, one or more of the processing units may be configured to execute a vertex shader program that processes a number of vertices defined by the model data. In an embodiment, the different processing units may be configured to execute different shader programs concurrently. For example, a first subset of processing units may be configured to execute a vertex shader program while a second subset of processing units may be configured to execute a pixel shader program. The first subset of processing units processes vertex data to produce processed vertex data and writes the processed vertex data to the L2 cache 460 and/or the memory 404. After the processed vertex data is rasterized (e.g., transformed from three-dimensional data into two-dimensional data in screen space) to produce fragment data, the second subset of processing units executes a pixel shader to produce processed fragment data, which is then blended with other processed fragment data and written to the frame buffer in memory 404. The vertex shader program and pixel shader program may execute concurrently, processing different data from the same scene in a pipelined fashion until all of the model data for the scene has been rendered to the frame buffer. Then, the contents of the frame buffer are transmitted to a display controller for display on a display device.

Images generated applying one or more of the techniques disclosed herein may be displayed on a monitor or other display device. In some embodiments, the display device may be coupled directly to the system or processor generating or rendering the images. In other embodiments, the display device may be coupled indirectly to the system or processor such as via a network. Examples of such networks include the Internet, mobile telecommunications networks, a WIFI network, as well as any other wired and/or wireless networking system. When the display device is indirectly coupled, the images generated by the system or processor may be streamed over the network to the display device. Such streaming allows, for example, video games or other applications, which render images, to be executed on a server, a data center, or in a cloud-based computing environment and the rendered images to be transmitted and displayed on one or more user devices (such as a computer, video game console, smartphone, other mobile device, etc.) that are physically separate from the server or data center. Hence, the techniques disclosed herein can be applied to enhance the images that are streamed and to enhance services that stream images such as NVIDIA GeForce Now (GFN), Google Stadia, and the like.

Example Streaming System

Figure 6:
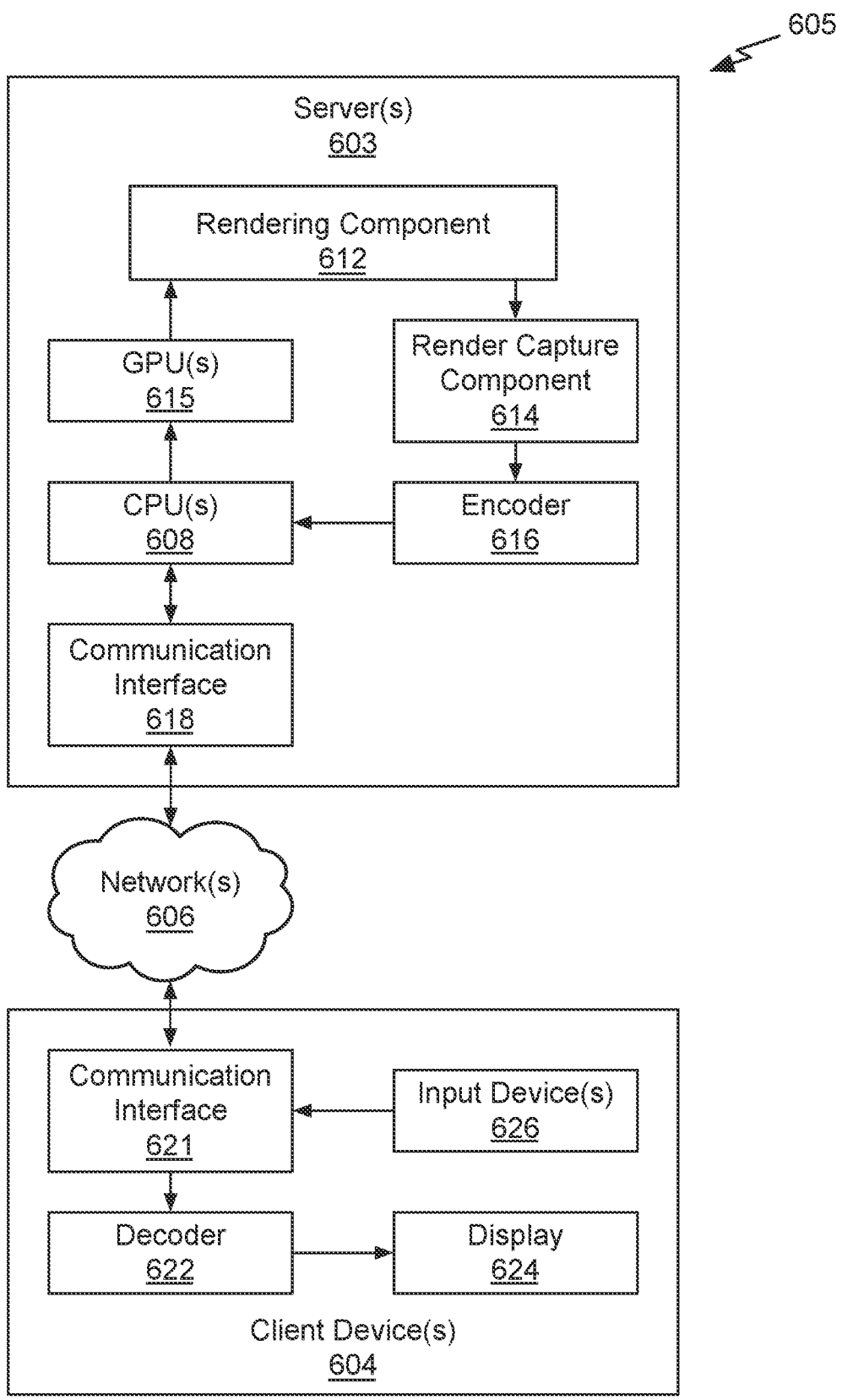
FIG. 6 illustrates an exemplary streaming system suitable for use in implementing some embodiments of the present disclosure.

FIG. 6 is an example system diagram for a streaming system 605, in accordance with some embodiments of the present disclosure. FIG. 6 includes server(s) 603 (which may include similar components, features, and/or functionality to the example processing system 500 of FIG. 5A and/or exemplary system 565 of FIG. 5B), client device(s) 604 (which may include similar components, features, and/or functionality to the example processing system 500 of FIG. 5A and/or exemplary system 565 of FIG. 5B), and network(s) 606 (which may be similar to the network(s) described herein). In some embodiments of the present disclosure, the system 605 may be implemented.

In an embodiment, the streaming system 605 is a game streaming system and the sever(s) 604 are game server(s). In the system 605, for a game session, the client device(s) 604 may only receive input data in response to inputs to the input device(s) 626, transmit the input data to the server(s) 603, receive encoded display data from the server(s) 603, and display the display data on the display 624. As such, the more computationally intense computing and processing is offloaded to the server(s) 603 (e.g., rendering—in particular ray or path tracing—for graphical output of the game session is executed by the GPU(s) 615 of the server(s) 603). In other words, the game session is streamed to the client device(s) 604 from the server(s) 603, thereby reducing the requirements of the client device(s) 604 for graphics processing and rendering.

For example, with respect to an instantiation of a game session, a client device 604 may be displaying a frame of the game session on the display 624 based on receiving the display data from the server(s) 603. The client device 604 may receive an input to one of the input device(s) and generate input data in response. The client device 604 may transmit the input data to the server(s) 603 via the communication interface 621 and over the network(s) 606 (e.g., the Internet), and the server(s) 603 may receive the input data via the communication interface 618. The CPU(s) 608 may receive the input data, process the input data, and transmit data to the GPU(s) 615 that causes the GPU(s) 615 to generate a rendering of the game session. For example, the input data may be representative of a movement of a character of the user in a game, firing a weapon, reloading, passing a ball, turning a vehicle, etc. The rendering component 612 may render the game session (e.g., representative of the result of the input data) and the render capture component 614 may capture the rendering of the game session as display data (e.g., as image data capturing the rendered frame of the game session). The rendering of the game session may include ray or path-traced lighting and/or shadow effects, computed using one or more parallel processing units—such as GPUs, which may further employ the use of one or more dedicated hardware accelerators or processing cores to perform ray or path-tracing techniques—of the server(s) 603. The encoder 616 may then encode the display data to generate encoded display data and the encoded display data may be transmitted to the client device 604 over the network(s) 606 via the communication interface 618. The client device 604 may receive the encoded display data via the communication interface 621 and the decoder 622 may decode the encoded display data to generate the display data. The client device 604 may then display the display data via the display 624.

It is noted that the techniques described herein may be embodied in executable instructions stored in a computer readable medium for use by or in connection with a processor-based instruction execution machine, system, apparatus, or device. It will be appreciated by those skilled in the art that, for some embodiments, various types of computer-readable media can be included for storing data. As used herein, a "computer-readable medium" includes one or more of any suitable media for storing the executable instructions of a computer program such that the instruction execution machine, system, apparatus, or device may read (or fetch) the instructions from the computer-readable medium and execute the instructions for carrying out the described embodiments. Suitable storage formats include one or more of an electronic, magnetic, optical, and electromagnetic format. A non-exhaustive list of conventional exemplary computer-readable medium includes: a portable computer diskette; a random-access memory (RAM); a read-only memory (ROM); an erasable programmable read only memory (EPROM); a flash memory device; and optical storage devices, including a portable compact disc (CD), a portable digital video disc (DVD), and the like.

It should be understood that the arrangement of components illustrated in the attached Figures are for illustrative purposes and that other arrangements are possible. For example, one or more of the elements described herein may be realized, in whole or in part, as an electronic hardware component. Other elements may be implemented in software, hardware, or a combination of software and hardware. Moreover, some or all of these other elements may be combined, some may be omitted altogether, and additional components may be added while still achieving the functionality described herein. Thus, the subject matter described herein may be embodied in many different variations, and all such variations are contemplated to be within the scope of the claims.

To facilitate an understanding of the subject matter described herein, many aspects are described in terms of sequences of actions. It will be recognized by those skilled in the art that the various actions may be performed by specialized circuits or circuitry, by program instructions being executed by one or more processors, or by a combination of both. The description herein of any sequence of actions is not intended to imply that the specific order described for performing that sequence must be followed. All methods described herein may be performed in any suitable order unless otherwise indicated herein or otherwise clearly contradicted by context.

The use of the terms "a" and "an" and "the" and similar references in the context of describing the subject matter (particularly in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. Furthermore, the foregoing description is for the purpose of illustration only, and not for the purpose of limitation, as the scope of protection sought is defined by the claims as set forth hereinafter together with any equivalents thereof. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

What is claimed is:

1. A system, comprising:
   a processor that is coupled to a base layer within a package that encloses the processor and the base layer; and
   the base layer comprising memory management logic that offloads memory interface steering tasks from the processor and is coupled between the processor and a memory system, wherein the memory management logic processes memory access requests received from the processor using interface mapping information stored in the memory management logic to map addresses received from the processor to interface specific addresses, and wherein the memory system comprises:
   at least one memory stack that is enclosed within the package and directly coupled to the memory management logic through a first controller within the base layer; and
   at least one memory device that is external to the package and coupled to the memory management logic through a memory device controller within the package, wherein
   the first controller stores first translation information for mapping the interface specific addresses to locations in the at least one memory stack,
   the memory device controller stores second translation information for mapping the interface specific addresses to locations in the at least one memory device, a near memory pool that is allocated a first memory access bandwidth and includes first locations in the at least one memory stack and second locations in the at least one memory device, a far memory pool that is allocated a second memory access bandwidth and includes third locations in the at least one memory device, and accesses are arbitrated according to the first memory access bandwidth comprising combined memory access bandwidth of the at least one memory stack and a portion of the at least one memory device and the second memory access bandwidth.

2. The system of claim 1, wherein the memory management logic migrates first data stored in fourth locations in the at least one memory device that are not included in the near memory pool to the near memory pool in response to determining that a threshold number of sectors have been loaded into a cache line for a page.

3. The system of claim 2, wherein portions of the first data are copied from the fourth locations to the near memory pool while at least one additional memory access request is processed.

4. The system of claim 2, wherein the memory management logic updates at least one of the first mapping information, the first translation information, or the second translation information for the first data to indicate that the first data is stored in the near memory pool.

5. The system of claim 2, wherein the memory management logic migrates data stored in the near memory pool to fifth locations in the at least one memory device that are not included in the first memory pool and updates at least one of the first mapping information, the first translation information, or the second translation information to indicate that the data is stored in the fifth locations.

6. The system of claim 1, wherein a capacity of the at least one memory stack is less than a capacity of the at least one memory device.

7. The system of claim 1, wherein, in response to a first memory access request, data stored in the at least one memory stack and the at least one memory device are transmitted through a connection between the processor and the base layer.

8. The system of claim 1, wherein the at least one memory device is coupled to the base layer by a first interface and the memory system further comprises at least one additional memory device that is external to the package and coupled to the base layer by a second interface that is separate from the first interface.

9. The system of claim 1, wherein at least a portion of the processor is included in a virtual machine.

10. The system of claim 1, wherein the processor is a part of a server or a data center, and data stored in the memory system is streamed to a user device.

11. The system of claim 1, wherein the processor generates data used for training, testing, or certifying a neural network employed in a machine, robot, or autonomous vehicle.

12. The system of claim 1, wherein at least a portion of the processor is included in a cloud computing environment.

13. The system of claim 1, wherein the memory management logic migrates first data stored in a fourth location in the at least one memory device that is not included in the near memory pool to the near memory pool by storing the first data to a cache before storing the first data to one of the first locations.

14. The system of claim 1, wherein when there are no accesses of the far memory pool, arbitration allows the near memory pool to consume more than the first bandwidth.

15. The system of claim 1, wherein when accesses of the near memory pool are below a threshold value, arbitration allows the far memory pool to temporarily consume more than the second bandwidth.

16. The system of claim 1, wherein the base layer prioritizes accesses of the near memory pool over accesses of the far memory pool.

17. The system of claim 1, further comprising an additional base layer comprising additional memory management logic coupled between the processor and an additional memory system.

18. A package comprising:
a base layer that is enclosed within the package, the base layer comprising:
a first interface for directly coupling a processor that is enclosed within the package to the base layer;
memory management logic that offloads memory interface steering tasks from the processor and is coupled between the interface and a memory system for processing memory access requests received at the interface using interface mapping information stored in the memory management logic to map addresses received from the processor to interface specific addresses for the first interface and a second interface; and
the second interface for transmitting memory access requests to at least one memory device that is external to the package and coupled to the memory management logic through a memory device controller within the package; and
at least one memory stack that is enclosed within the package and directly coupled to the memory management logic through a first controller within the base layer, wherein
the first controller stores first translation information for mapping the interface specific addresses to locations in the at least one memory stack,
the memory device controller stores second translation information for mapping the interface specific addresses to locations in the at least one memory device,
a near memory pool that is allocated a first memory access bandwidth and includes first locations in the at least one memory stack and second locations in the at least one memory device,
a far memory pool that is allocated a second memory access bandwidth and includes third locations in the at least one memory device, and
accesses are arbitrated according to the first memory access bandwidth comprising combined memory access bandwidth of the at least one memory stack and a portion of the at least one memory device and the second memory access bandwidth.

19. The package of claim 18, wherein, in response to a memory access requests received from the processor, data is transmitted between the memory management logic and both the at least one memory stack and the at least one memory device.

20. A method, comprising:
receiving memory access requests from a processor that is coupled to a base layer within a package; and
processing the memory access requests, by memory management logic that offloads memory interface steering tasks from the processor and is fabricated within the base layer and coupled between the processor and a memory system, by:

transmitting, using interface mapping information stored in the memory management logic to map addresses received from the processor to interface specific addresses, a first portion of the memory access requests to at least one memory stack that is enclosed within the package and directly coupled to the memory management logic through a first controller within the base layer; and transmitting a second portion of the memory access requests to at least one memory device that is external to the package and coupled to the memory management logic through a memory device controller within the package through a first connection, wherein the first controller stores first translation information for mapping the interface specific addresses to locations in the at least one memory stack, the memory device controller stores second translation information for mapping the interface specific addresses to locations in the at least one memory device, a near memory pool that is allocated a first memory access bandwidth and includes first locations in the at least one memory stack and second locations in the at least one memory device, a far memory pool that is allocated a second memory access bandwidth and includes third locations in the at least one memory device, and accesses are arbitrated according to the first memory access bandwidth comprising combined memory access bandwidth of the at least one memory stack and a portion of the at least one memory device and the second memory access bandwidth.

21. The method of claim 20, wherein an additional base layer comprising additional memory management logic is coupled between the processor and an additional memory system.

* * * * *